(12) United States Patent
Shan et al.

(10) Patent No.: US 7,569,764 B2
(45) Date of Patent: Aug. 4, 2009

(54) SOLAR MODULES WITH TRACKING AND CONCENTRATING FEATURES

(75) Inventors: Wei Shan, Fremont, CA (US); Gang Wang, Milpitas, CA (US); Xiao Dong Xiang, Danville, CA (US)

(73) Assignee: Intematix Corporation, Fremont, CA (US)

( * ) Notice: Subject to any disclaimer, the term of this patent is extended or adjusted under 35 U.S.C. 154(b) by 56 days.

(21) Appl. No.: 11/698,748

(22) Filed: Jan. 25, 2007

(65) Prior Publication Data

US 2007/0251569 A1 Nov. 1, 2007

Related U.S. Application Data

(60) Provisional application No. 60/762,298, filed on Jan. 25, 2006, provisional application No. 60/789,427, filed on Apr. 4, 2006, provisional application No. 60/787,932, filed on Mar. 31, 2006, provisional application No. 60/830,387, filed on Jul. 11, 2006, provisional application No. 60/838,943, filed on Aug. 18, 2006.

(51) Int. Cl.
*H01L 31/052* (2006.01)

(52) U.S. Cl. .................. 136/246; 136/259; 136/251

(58) Field of Classification Search .............. 136/243, 136/246, 259; 126/571, 573, 624, 683; 362/238, 362/209, 421
See application file for complete search history.

(56) References Cited

U.S. PATENT DOCUMENTS

| 4,000,734 | A | * | 1/1977 | Matlock et al. | ............. 126/576 |
| 5,169,456 | A |   | 12/1992 | Johnson |  |
| 5,317,145 | A | * | 5/1994 | Corio | ........................ 250/203.4 |
| 5,600,124 | A | * | 2/1997 | Berger | ........................ 250/203.4 |
| 5,660,644 | A | * | 8/1997 | Clemens | .................... 136/245 |
| 6,384,320 | B1 | * | 5/2002 | Chen | .......................... 136/259 |
| 6,843,573 | B2 |   | 1/2005 | Rabinowitz |  |
| 7,109,461 | B2 |   | 9/2006 | Lasich |  |
| 7,240,674 | B2 |   | 7/2007 | Patterson |  |
| 2004/0025931 | A1 | * | 2/2004 | Aguglia | ..................... 136/246 |

* cited by examiner

*Primary Examiner*—Alex Noguerola
*Assistant Examiner*—Dustin Q Dam
(74) *Attorney, Agent, or Firm*—Quine Intellectual Property Law Group; Gary Baker

(57) ABSTRACT

Disclosed are fixed solar-electric modules having arrays of solar concentrator assemblies capable of separately tracking movements through one or two degrees of rotational freedom to follow the movement of the sun daily and/or seasonally. The concentrators can include optical elements to direct and concentrate light onto photovoltaic and/or thermoelectric receivers for generation of electric current.

10 Claims, 23 Drawing Sheets

SOLAR MODULES WITH TRACKING AND CONCENTRATING FEATURES

CROSS-REFERENCE TO RELATED APPLICATIONS

This application claims priority to and benefit of prior U.S. Provisional Application Nos.: 60/762,298, Solar Module with Embedded Concentrator Assembly, filed Jan. 25, 2006; 60/789,427, Solar Module and Concentrator Assembly with Cooling Means, filed Apr. 4, 2006; 60/787,932, Collective 2-D Tracking System for Solar Module with Embedded Concentrator Assembly, filed Mar. 31, 2006; 60/830,387, Solar Module with Embedded Concentrator Assembly, filed Jul. 11, 2006; and, 60/838,943, Moisture Abatement in Solar Concentrator Modules, filed Aug. 18, 2006. The full disclosure of the prior applications are incorporated herein by reference.

FIELD OF THE INVENTION

Embodiments of the present invention are directed in general to tracking systems for photovoltaic and thermoelectric solar modules and combinations of such technologies that efficiently convert solar energy directly into electrical energy. In particular, the embodiments are directed to opto-mechanical solar irradiation concentrator assemblies that can be embedded in a sealed panel structure similar to conventional terrestrial weather-proof flat-panel modules useful in conversion of solar energy into electricity.

BACKGROUND OF THE INVENTION

Photovoltaic technologies can be divided into two main groups: flat plates and concentrators. Flat-plate technologies include full area coverage of solar cells between a glass cover and an aluminum (or glass) support. The solar cells can be based on crystalline silicon (from both ingot and ribbon or sheet-growth techniques) or thin films of various semiconductor materials, usually deposited on low-cost substrates, such as glass, plastic, or stainless steel. Deposition techniques typically comprise some type of vapor deposition, electrodeposition, or wet chemical process. In the flat plate technology, solar cells are illuminated directly by sunlight. In concentrator type systems, optical elements are utilized to focus sunlight on to one or more solar cells. For example, a system of lenses and/or reflectors constructed from less expensive materials can be used to focus sunlight on smaller (somewhat more expensive, but highly efficient) solar cells.

Concentrator systems utilize optical elements to focus sunlight before it illuminates a solar cell. A system of lenses or reflectors made from relatively inexpensive materials is used to focus sunlight on smaller, somewhat more expensive, but highly efficient solar cells. Concentration of sunlight by optical means can reduce the required surface area of photovoltaic material while enhancing solar-energy conversion efficiency. One example of a concentrator element is a cylindrical (or cylindrical section) lens that focuses sunlight on to a surface in a linear pattern. By placing a solar cell strip or a linear array of solar cells in the focal plane of such a lens, the focused sunlight can be absorbed and converted directly into electricity by the cell or the array of cells under multi-sun illumination conditions. More electrical energy can be generated from such a concentrator than from a flat plate cell with the same surface area. See, for example, S. M. Sze, *Physics of Semiconductor Devices,* (John Wiley and Sons, New York, 1981), chapter 14.

Today's solar concentrator systems are generally not compatible with flat-panel modules adapted for residential rooftop installation. Excluding applications as power supplies to satellites and space vehicles, the prior art can essentially be categorized into two types: 1) gigantic individual solar concentrators with the capability of greater than 100 times solar concentration; and 2) panels holding a plurality of concentrators with low or moderate concentration (between about 2 times and 50 times solar concentration) that are fixed to the panel. There are two apparent drawbacks to these prior art approaches when applied to residential roof top installations. First, the concentrators require a tracking mechanism to maintain an optimum angle with incident sunlight ray parallel to the input axis of the concentrator optics. This has been accomplished conventionally by independently rotating individual concentrators in separate frames with separate power sources, or by rotating an entire panel of several concentrators together frozen in the same frame about one or two axes to track the sun's movement. A number of U.S. patents have been granted over the past 30 years directed to this type of approach. Second, most concentrator optics need to be large in size to achieve a high degree of concentration and, therefore, are inappropriate for a flat panel applications having thin solar cell modules. Sun tracking panels are difficult to install on residential rooftops, and current tracking mechanisms which move the entire module frame are bulky and expensive to maintain.

Typically, a solar concentrator or panel of fixed concentrators is not an isolated unit, but rather a part of a larger assemblage deployed in their own frames on a surface of finite dimensions to collect sun power for electricity generation. As a result, one collector will block tracking motions or cast a shadow on the aperture of another collector. To solve this problem, enough frame mounting area (or "real estate") is provided so that individual solar collectors can be spaced sufficiently far enough apart to minimize shadowing. However, this can create space between collectors where no light can be collected.

Spacing of individual solar cells has a couple of important considerations: 1) what is the appropriate spacing for positioning a plurality of solar concentrators in a given area of finite dimensions, and 2) how should the solar concentrators be deployed, with the assistance of sun tracking, in order to extract as much power as possible from the solar irradiation that falls into that area. When a number of concentrators or concentrator panels capable of tracking the sun's position are grouped together as an array of solar energy collectors, a certain spacing between each individual concentrator is necessary to avoid the shadowing effect caused by the tilting of the concentrators while tracking the sun's movement. This concept is illustrated in FIG. 1. As illustrated in FIG. 1, a plurality of concentrators 10 with aperture dimension 11 of w is separated linearly with an equal distance of d. The spacing between the aperture edges 12 of the adjacent concentrators is g(=d−w). As the aperture normal 13 of concentrators is tilted (e.g., towards the east to face the morning sunshine), the tilt angle ψ 14, which is the angle between the aperture normal and the vertical, can reach a critical point where shadowing does occur. The critical angle $\psi_{th}$ is related to the spacing g as follows:

$$\psi_{th} = \cos^{-1}\left(\frac{1}{1+g/w}\right). \tag{1}$$

This means that the entire acceptance aperture of every concentrator is fully sun-irradiated as long as $\psi<\psi_{th}$. When the sunlight available to a particular concentrator is partially blocked due to shadowing, the area $A(\psi)$ on the acceptance aperture 15 of a concentrator that is illuminated decreases as the tilt angle increases due to a cosine effect:

$$A(\psi) = \begin{cases} w & \psi \leq \psi_{th} \\ w(1+g/w)\cos(\psi) & \psi > \psi_{th} \end{cases}. \quad (2)$$

This is shown graphically in FIG. 2.

In the real world, solar irradiance to a given area is fixed. The efficiency of solar collection, which can be defined as the ratio of the collectable solar energy to the solar irradiance to the area in question, is the most important factor contributing to overall solar-energy conversion. It is obvious that a large spacing between concentrators, g, wastes useful solar irradiance because a certain part of photon flux from the sunlight (proportional to the spacing dimension) is not collected. The solar-collection efficiency per unit area, or "area efficiency" $\eta_A(\psi)$, can be expressed as:

$$\eta_A(\psi) = \frac{A(\psi)}{d} = \begin{cases} \frac{1}{1+g/w} & \psi \leq \psi_{th} \\ \cos(\psi) & \psi > \psi_{th} \end{cases} \quad (3)$$

These expressions reveal that the actual solar energy in a given area that can be collected by concentrators is a function of the tilt angle $\psi$ for sun tracking, which is directly correlated to the time. The efficiency also varies with the ratio g/w.

The collectable solar irradiation energy for such a concentrator array at a given tilt angle can be expresses as the product of the solar-collection efficiency $\eta_A(\psi)$ and the direct solar irradiance $I(\psi)$:

$$W(\psi)=\eta_A(\psi)I(\psi). \quad (4)$$

Note that the direct sun irradiance $I(\psi)$, explicitly expressed here as a generalized case, is a function of $\psi$. It actually depends on the geographic location, panel orientation, as well as the local date and time. The collectable solar energy by an array of solar concentrators in a given area decreases drastically as the spacing between the adjacent concentrators is increased. Therefore, the answer to the questions above is that when multiple sun tracking concentrators are deployed in a given area of finite dimensions, spacing between adjacent concentrators should be minimized as much as possible, so long as the moving concentrators do not interfere with one another.

While the prior art provides parameters that should be optimized for particular situations, it does not provide satisfactory solutions. In view of the above, a need exists for more efficient concentrators and optical-mechanical tracking systems that can maximize photon capture in a minimum of space. Once light is captured, there remains a need to increase the efficiency of conversion to electricity. It would be desirable to provide maintenance-free concentrator systems designed to be compatible with flat-panel modules and capable of tracking sun movement without relying on rotation of the whole panel. Reduced costs could also be realized through concentrator systems that direct a large window of incident light onto smaller photovoltaic surfaces. What is needed in the art is a third, new type of solution, comprising, and suitable for (e.g.) residential markets. The present invention provides these and other features that will be apparent upon review of the following.

SUMMARY OF THE INVENTION

Embodiments of the present invention are directed to a solar module packaging and assembly of a plurality of linear solar concentrators, the solar module and concentrator assembly system capable of converting solar energy into electricity. The assembly can be embedded in a sealed structure that is similar in dimensions to conventional terrestrial weather-proofed modules. Each individual linear concentrator can possess a freedom of axial rotation while being sealed inside the fixed structure, the axial rotation providing the mechanics to realize solar tracking collectively for an array of concentrator assemblies. With such an arrangement, the frame holding the concentrator array can remain stationary, so space does not need to be dedicated to pivoting or the frame. The solar module can be constructed in such a way that sun tracking solar concentrators can be pivotably mounted and enclosed inside the module to reduce the number of solar cells needed, while simultaneously enhancing photovoltaic efficiency in a module configured as a fixed flat-panel structure. The concentrator assemblies used in the array can be composed of optical elements and solar irradiation receivers for converting solar energy into electricity.

In one aspect of the invention, the solar-electric device includes one or more solar concentrator assemblies having a solar tracking capability. For example, the assemblies can include an array of photovoltaic receivers and/or thermoelectric receivers, one or more optical concentrators configured to reflect and/or refract solar radiation onto the array of receivers when aperture normals of the concentrators are aligned with the sun, and a tracking mechanism for maintaining alignment of the aperture normals with the sun by at least once daily alignment adjustments to account for seasonal variations in angle of incidence of solar radiation. In a typical embodiment, optical concentrator assembly possesses at least one degree of freedom of rotation through an arch of at least 23 degrees. Optionally, the tracking adjustments can be made continuously, about every second, about every minute, or about every hour, e.g., during the day. In preferred embodiments, the optical concentrator can be a convex lens, a GRIN lens having a refractive index gradient increasing from its center plane, a Fresnel lens, a hybrid lens having a cylindrical lens in the center and a set of total internal refection (TIR) structures on the edges, a parabolic reflector, and/or a pair of compound parabolic reflective mirrors. The optical concentrator can be is configured to concentrate light from the sun onto the receivers in the assembly by a factor or 5, 10, 25, 50, 100, 200, or more.

Fixed solar modules can include an array of concentrator assemblies in a relatively small package. A typical solar module of the invention is wider and longer than it is deep (thick). For example, the modules can have a length and/or width ranging from about 6 inches to 10 feet, or more, 1 foot to about 6 feet, or about 4 feet. In typical embodiments, the solar modules have a thickness ranging from about 0.5 inches to about 2 feet, from 1 inch to 1 foot, or about 2 inches. Typical modules with linear concentrator assemblies can include, e.g., three or more, 5, 10, 50, 100, one thousand, or more separate concentrator assemblies mounted to the module frame in an array, e.g., of one, two three, 5, 10, 100, 1000, or more, rows or columns. Typical modules with concentrator assemblies movable through two degrees of freedom can include, e.g., four or more, 6, 10, 25, 100, one thousand, ten thousand, or more separate concentrator assemblies mounted to the module frame in an array, e.g., of one, two three, 5, 10, 100, 1000, or more, rows or columns. Individual linear concentrator assemblies can have a length ranging from about 6 inches to about 10 feet or more, one foot to about 6 feet or about 4 feet; and, a width and/or height ranging from about 0.5 inches to about 1 foot or more, from about 1 inch to about 8 inches, from about 2 inches to about 6 inches, or about 4 inches. In a typical embodiment, a fixed sealed solar module 6 feet by 4 feet by 6 inches holds a movable array of 12 linear concentrator assemblies, each a little less than 6 feet long, 4 inches wide and 4 inches tall. In a typical embodiment with 2-D tracking assemblies, a fixed sealed solar module 6 feet by 4 feet by 6 inches holds a movable array of 216 (18 rows by 12 columns) 2-D concentrator assemblies, each with an aperture a little less than 4 inches by 4 inches and about 4 inches tall.

The solar assembly tracking mechanism can include, e.g., an array of light detectors that provide a first pattern of detector signals when the concentrator aperture normals are aligned with the sun and a second different pattern of detector signals when the normals are not aligned with the sun. The different pattern can be interpreted according to a defined algorithm to determine the relative angle and direction the module must be turned to provide alignment with the sun. In particular embodiments, power used to drive the tracking mechanism adjustments can be derived from one or more non-concentrated, flat-plate solar cells. In this way, power can be provided to tracking motors even when the concentrators are not aligned with the sun.

Energy conversion efficiency of the solar modules can be enhanced by including both photovoltaic and thermoelectric receivers in a hybrid system. For example, the array of receivers can be configured with the photovoltaic receivers mounted in thermoconductive contact with the thermoelectric receivers so that the photovoltaic receivers can convert usable light into electricity while the thermoelectric receivers cool the system and convert heat to additional electricity. Alternately, the solar modules can include devices to refract and direct long wavelengths to thermoelectric receivers while allowing usable visible and UV frequencies to strike photovoltaic receivers. For example, the concentrator assemblies can include a prism, diffraction grating or optical band pass filter to direct visible light to the photovoltaic receiver array and to direct infrared light to the array of thermoelectric receivers.

The invention includes methods and systems to remove excess heat from modules to reduce thermal stresses and to enhance the efficiency of the solar receivers. In a basic embodiment, the backing plate of the module can act as a heat sink in thermal conductive contact with the array of receivers to remove heat during operation. In embodiments wherein more rapid heat removal is desired, the solar module can include a coolant fluid in a conduit mounted in thermoconductive contact with the photovoltaic receivers and/or the thermoelectric receivers. The coolant can optionally flow in a coolant loop, e.g., to an external heat exchanger to release heat from the solar module into ambient air.

In many embodiments, the modules include an array of elongate optical concentrators in concentrator assemblies mounted with a single degree of rotational freedom about an axis. The rotational axis can optionally be aligned east-west with rotational freedom is not less than 10 degrees, 15 degrees, 20 degrees or 23 degrees, e.g., for adjustments to track the sun through seasonal variations (i.e., through the different paths between equinox and solstice). Optionally, the rotational axes of the concentrators can be aligned north-south with rotational freedom not less than 90 degrees, 120 degrees, 160 degrees or 180 degrees, e.g., for tracking adjustments following the sun as it moves across the sky throughout the day.

In more complex embodiments, each member of a solar concentrator array is pivotably mounted to the frame of the module and capable of tracking the sun in two dimensions (N-S/E-W) across the sky using tracking systems capable of motions through two degrees of rotational freedom. For example, the solar-electric modules can include an array of concentrator assemblies each having a photovoltaic receiver and/or a thermoelectric receiver and comprising one or more optical concentrators (optical reflectors or lenses) configured concentrate sunlight onto the receiver, and a tracking mechanism configured to move each member of the concentrator array through two degrees of rotational freedom so that the members of the concentrator array can be moved in unison following the relative movement of the sun across the sky through the day, including incremental adjustments for seasonal variations. In preferred embodiments, the concentrators include both photovoltaic cells and thermoelectric cells. It is preferred the optical concentrators provide a concentration factor of solar radiation ranging from about 10-fold to about 250-fold, or from about 25-fold to about 100-fold, or about 50-fold. In a particular embodiment of tracking mechanisms having two degrees of freedom, the mechanism includes one or more spheroids attached to each concentrator array member. The spheroids can be restrained by a planar top plate while the spheroids are supported by a bottom plate that can be translated relative to the top plate in two perpendicular directions along the same plane as the top plate. In this way, relative motion of the top and bottom plates can roll the spheroids through two degrees of freedom, rotating the concentrators in unison to direct them at any location in the sky. The tracking mechanism can further include a frame board with sockets to receive the spheroids and mounted between the top plate and bottom plate. In preferred embodiments of 2-D tracking systems, the first degree of rotational freedom ranges through at least 5, 10 20 or 23 degrees of rotation and the second degree of freedom ranges through at least 90, 120 170 or 180 degrees of rotation.

Concentrator assemblies of the invention are often disposed within sealed solar-electric modules. Within such modules, condensation of water can be a problem. In an aspect of the invention, moisture is controlled within the solar collector system to protect system components from corrosion and reduce interference with system light paths due to condensation. For example, solar concentrator systems with moisture abatement capability can include a sealed solar module having a channel fluidly connecting an internal space of the module to an external environment so that air can flow into and out of the module. A water vapor trap can be in fluid contact with the channel and include a condenser or chemical desiccant to remove water vapor from air flowing through the channel. In preferred embodiments, the water vapor trap is positioned outside the module, e.g., for ready access and desirable exposure to the external environment. In more preferred embodiments, the water vapor trap is configured to release trapped water upon heating of the trap while air is flowing from the module, through the trap, and out to the external environment. For example, the water vapor trap can have a black outer surface so that water is released from the absorbent when sunlight shines on the trap and module. This can allow regeneration of the trap and elimination of water that had accumulated while air was entering the module. For example, the water vapor trap can contain a moisture absorbing material that tends to absorb water vapor when cooled and tends to release water when heated. The trap can be heated by sunlight, surrounding ambient hot air, circulating system coolant, or electrical current, to release moisture when air is flowing out of the module. Exemplary moisture absorbing materials include, e.g., silica gel, cobalt chloride, calcium hydride, a molecular sieve, zeolite, clay, lithium chloride (LiCl), sodium polyacrylate, and/or the like.

In an embodiment of systems of the invention with moisture abatement capabilities, a vent channel between the trap and external environment can be long and thin (e.g., 6 inches, 12 inches, 24 inches or more long, and 1 mm, 0.5 mm, 0.25 mm or less internal diameter) to reduce the intrusion of water vapor into the water trap by diffusion. It is preferred embodiment, the vent channel is coiled to make it more compact. For example, a solar concentrator system with moisture abatement capability can include a sealed solar concentrator module having a channel fluidly connecting an internal space of the module to an external environment through a water vapor trap, and the channel between the vapor trap and the external environment can include a coiled tube with an internal diameter of less than 0.5 mm. In preferred embodiments of water abatement methods, the water trap can be heated at appropriate times. For example, the invention includes methods of abating condensation inside solar concentrator module by providing a channel fluidly connecting an internal space of the module to an external environment through a water vapor trap, and heating the vapor trap when air is flowing from the interior space to the external environment.

DEFINITIONS

Unless otherwise defined herein or below in the remainder of the specification, all technical and scientific terms used herein have meanings commonly understood by those of ordinary skill in the art to which the present invention belongs.

Before describing the present invention in detail, it is to be understood that this invention is not limited to particular devices or biological systems, which can, of course, vary. It is also to be understood that the terminology used herein is for the purpose of describing particular embodiments only, and is not intended to be limiting. As used in this specification and the appended claims, the singular forms "a", "an" and "the" include plural referents unless the content clearly dictates otherwise. Thus, for example, reference to "a component" can include a combination of two or more components; reference to "coolants" can include mixtures of coolants, and the like.

Although many methods and materials similar, modified, or equivalent to those described herein can be used in the practice of the present invention without undue experimentation, the preferred materials and methods are described herein. In describing and claiming the present invention, the following terminology will be used in accordance with the definitions set out below.

As used herein, the term "solar module" refers to a stationary frame holding one or more movable concentrator assemblies. For example, a solar module can be a fixed frame to which an array of two or more concentrator assemblies are each pivotably mounted to provide one or two degrees of rotational freedom. The modules can include a sealed or sealable housing defining a space within which the array of concentrator assemblies are protected and functionally movable to track the sun.

The term "concentrator assembly" refers to an assembly of an optical concentrator and one or more receivers. Arrays of concentrator assemblies can be mounted to a solar module for solar tracking motions while the module itself remains stationary.

The term "receiver" refers to a photovoltaic receiver or thermoelectric receiver.

The term "rotational freedom" refers to ability of a component to pivot about an axis. A concentrator assembly with one degree of rotational freedom can pivot on one axis (e.g., an X axis) so a point on the concentrator can move in an arch within a plane, but not in three dimensions. A concentrator assembly with two degrees of rotational freedom can pivot on two axes (e.g., X and Y axes) so that a point on the concentrator can pivot through three, e.g., thus allowing an aperture normal line to be directed at any point in an area of the sky.

DETAILED DESCRIPTION

The present inventions provide combinations of features useful in increasing the efficiency and lowering the cost of power production from sunlight. Systems of the invention provide mechanical and optical components that can optimize capture of sunlight for all seasons and times of day in a relatively thin and stationary module. Systems of the invention can include arrays of photovoltaic cells disposed to each receive appropriate frequencies of the incoming spectrum through devices of the invention. Efficiencies can be further improved by providing thermoelectric devices in the systems to generate voltages from waste heat, cooling components to enhance the efficiency of the voltaic components, and vapor entrapment systems to prevent fogging of optic components.

Solar-electric systems of the invention provide devices to efficiently convert solar rays and/or heat to electrical power. Tracking systems are provided to follow the sun with concentrators with one or two degrees of rotational freedom of movement. Descriptions are provided to configure combinations of photovoltaic and thermoelectric receivers in efficient hybrid solar-electric systems. As the thin modules of the invention are typically enclosed in protective sealed compartments, methods and systems are provided to avoid water vapor condensation on the internal workings of the systems.

Linear Solar Concentrators with One Degree of Movement

Linear solar concentrators assemblies of the invention typically have a linear photovoltaic (PV) and/or thermoelectric (TE) receiver in a channel receiving concentrated solar radiation from elongate optical concentrator elements. Solar tracking systems with one degree of rotational freedom of movement offer the advantage of simplicity. Elongate receivers take minimal losses from lateral concentrator focus errors because laterally shifted light merely strikes the receiver surface at an adjacent point down the line along the receiver. Therefore, one degree of motion is typically enough to provide high degrees of concentrator efficiency for elongate (linear) receivers. In a simple embodiment, the linear receiver is aligned east to west and can efficiently receive sunlight all day, as long as the concentrator is tilted south (in applications north of the tropics) an appropriate amount to make up for the seasonal variation due to the inclination of the earth's spin axis relative to the earth's orbital axis.

Disclosed herein is a solar module designed to have one or more compartments for mounting one or more concentrator assemblies. In one embodiment, the top cover of the module is a glass substrate, and the frames as well as the bottom cover are metallic materials chosen for their mechanical rigidity, chemical stability, and thermal conductivity.

Figure 1:
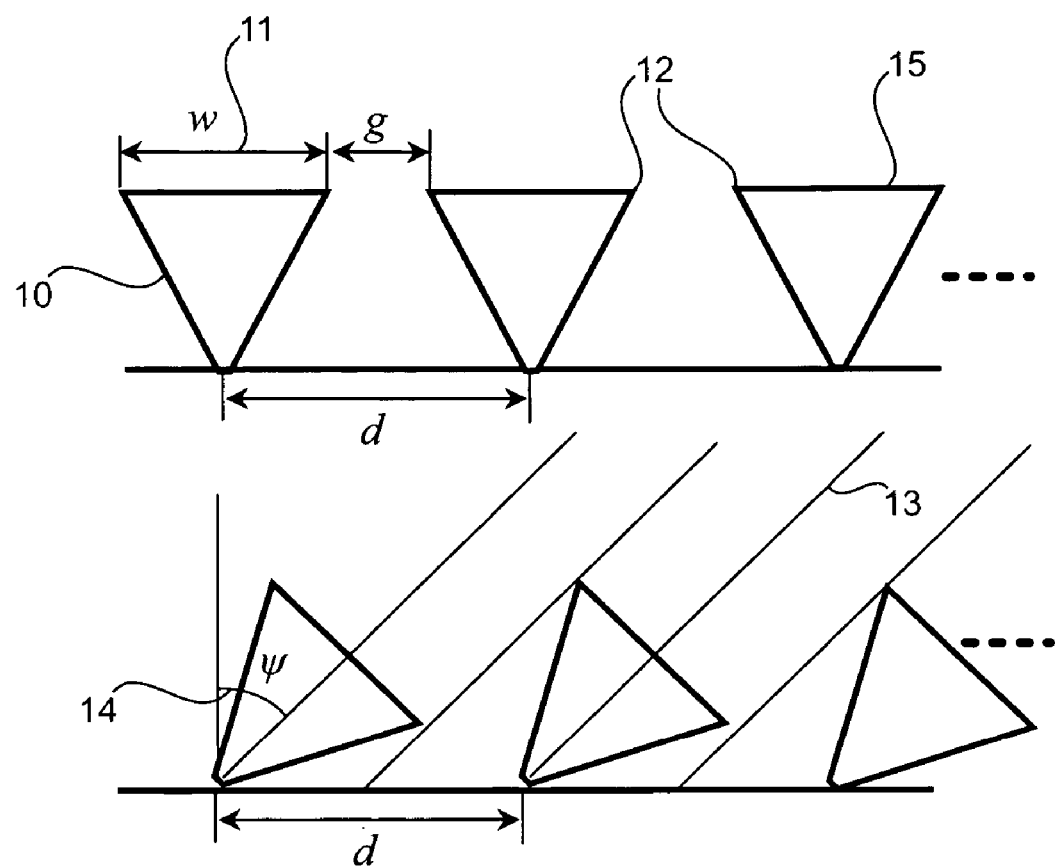
FIG. 1 is a schematic diagram illustrating the concept of a shadowing effect in a linearly aligned solar concentrator module array.
Figure 2:
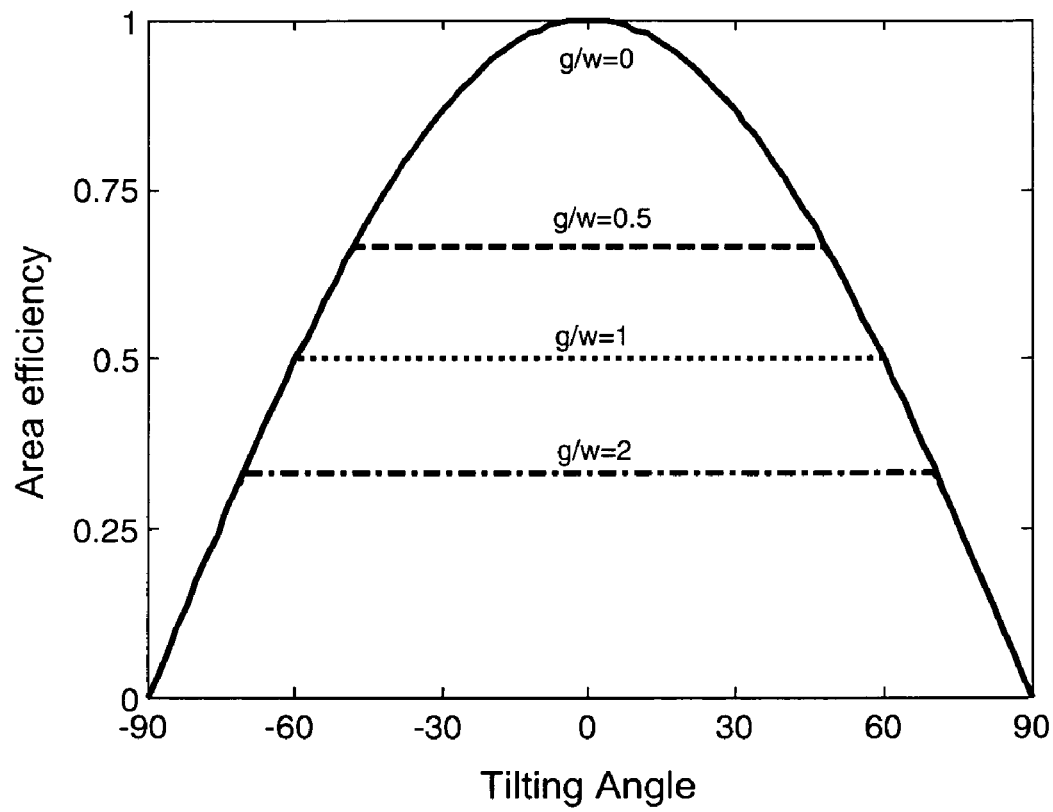
FIG. 2 is a graph showing the efficiency of solar-energy collection as a function of tilt angle, as well as the ratio of the spacing between two adjacent concentrators (g) to the aperture of concentrator (w). Efficiency of solar energy collection is provided as a function of tilt angle. Leaving large spacing between adjacent concentrators in a given area to avoid shadowing can significantly reduce collection efficiency per collector area.
Figure 3A:
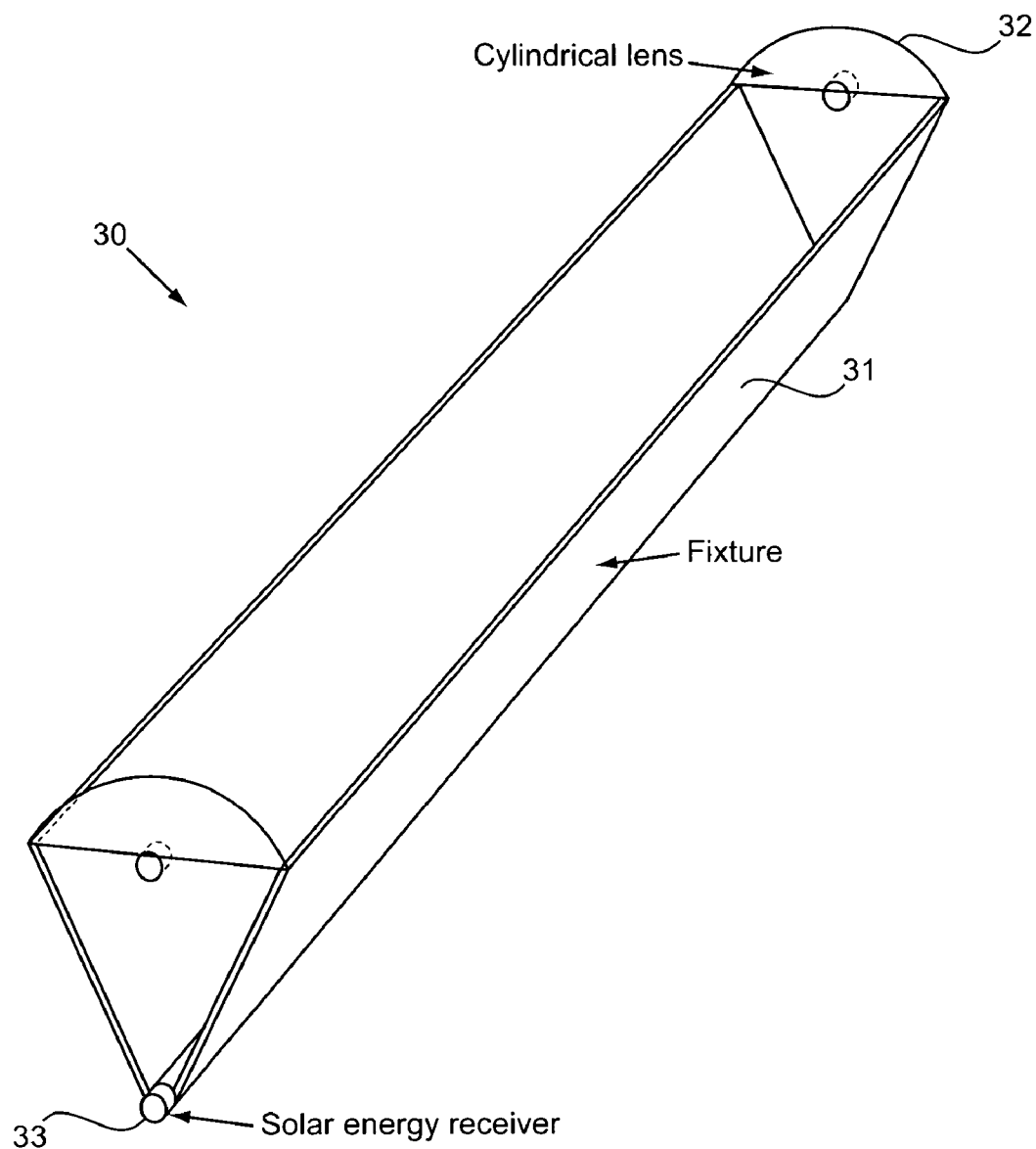
FIG. 3A is a schematic diagram of a solar concentrator module assembly, including a cylindrical lens as the light concentrator and a solar energy receiver for converting photons to electricity.
Figure 3B:
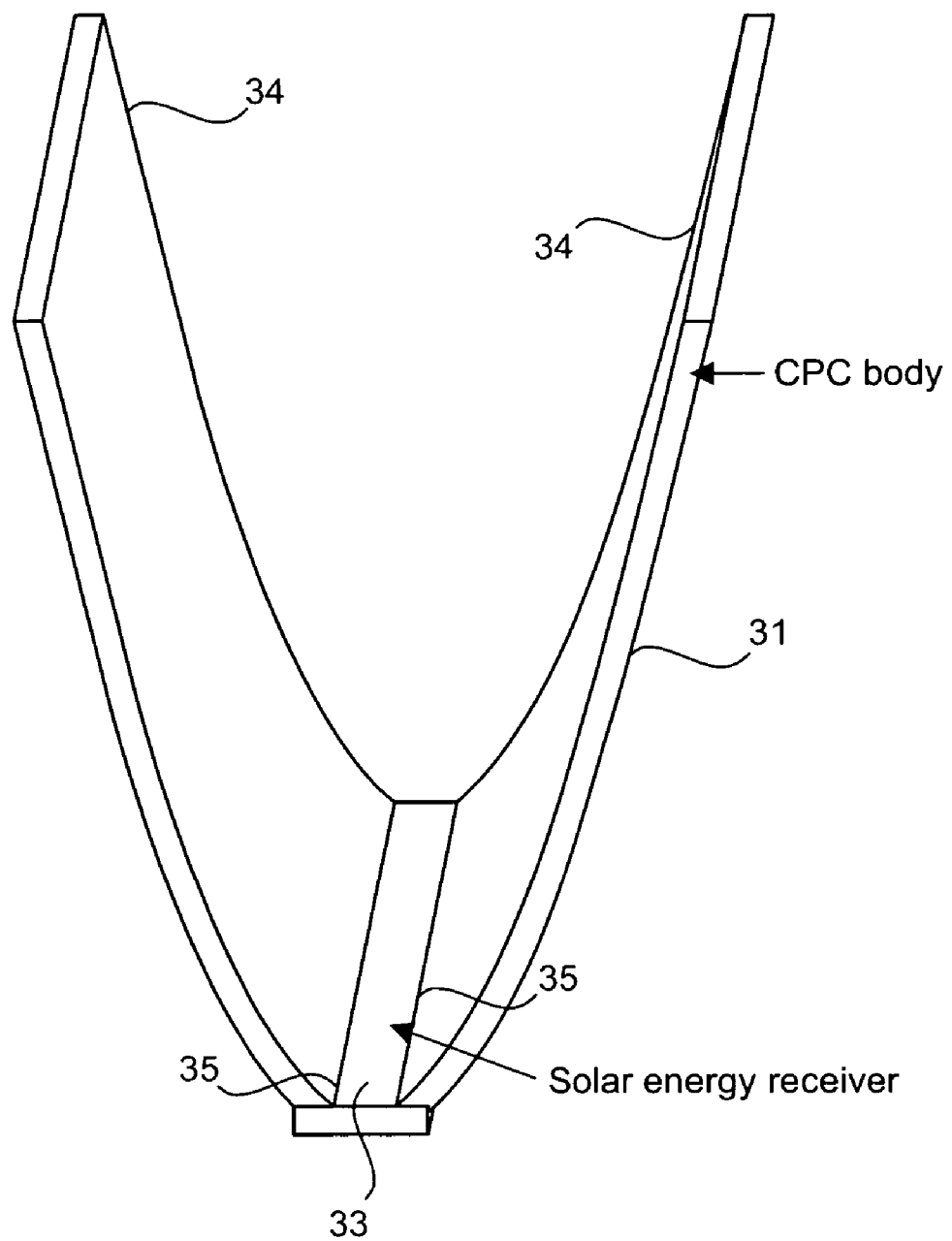
FIG. 3B is a schematic of a solar concentrator assembly, including a pair of compound parabolic mirrors and a solar energy receiver.

The solar concentrator assembly can comprise a strip of photovoltaic receivers, thermoelectric receivers, and/or a combination of both photovoltaic and thermoelectric receivers, and an elongated optical concentrator component that illuminates the receiver with concentrated sunlight. The elongated optical component can include a cylindrical lens or a compound parabolic mirror set in trough shape, to list a few possibilities, as demonstrated by the schematic diagrams of FIGS. 3A and 3B, respectively. As shown in FIG. 3A, the concentrator assembly 30 can include a fixture 31 to maintain the lens 32 and the receiver 33 in a desired configuration. In preferred embodiments, the fixture acts as a parabolic reflector with a focal point at the receiver or a compound parabolic reflector with foci at a receiver surface, as shown in FIG. 3B.

A plurality of linear concentrator assemblies can be mechanically linked inside a module panel structure. The motion of the assemblies can be collectively controlled by a driving mechanism designed to track the sun's relative movement across the sky. The driving mechanism can be installed either inside a sealed module or outside of the module, such that a plurality of modules can be driven with a single tracking mechanism.

Figure 4A:
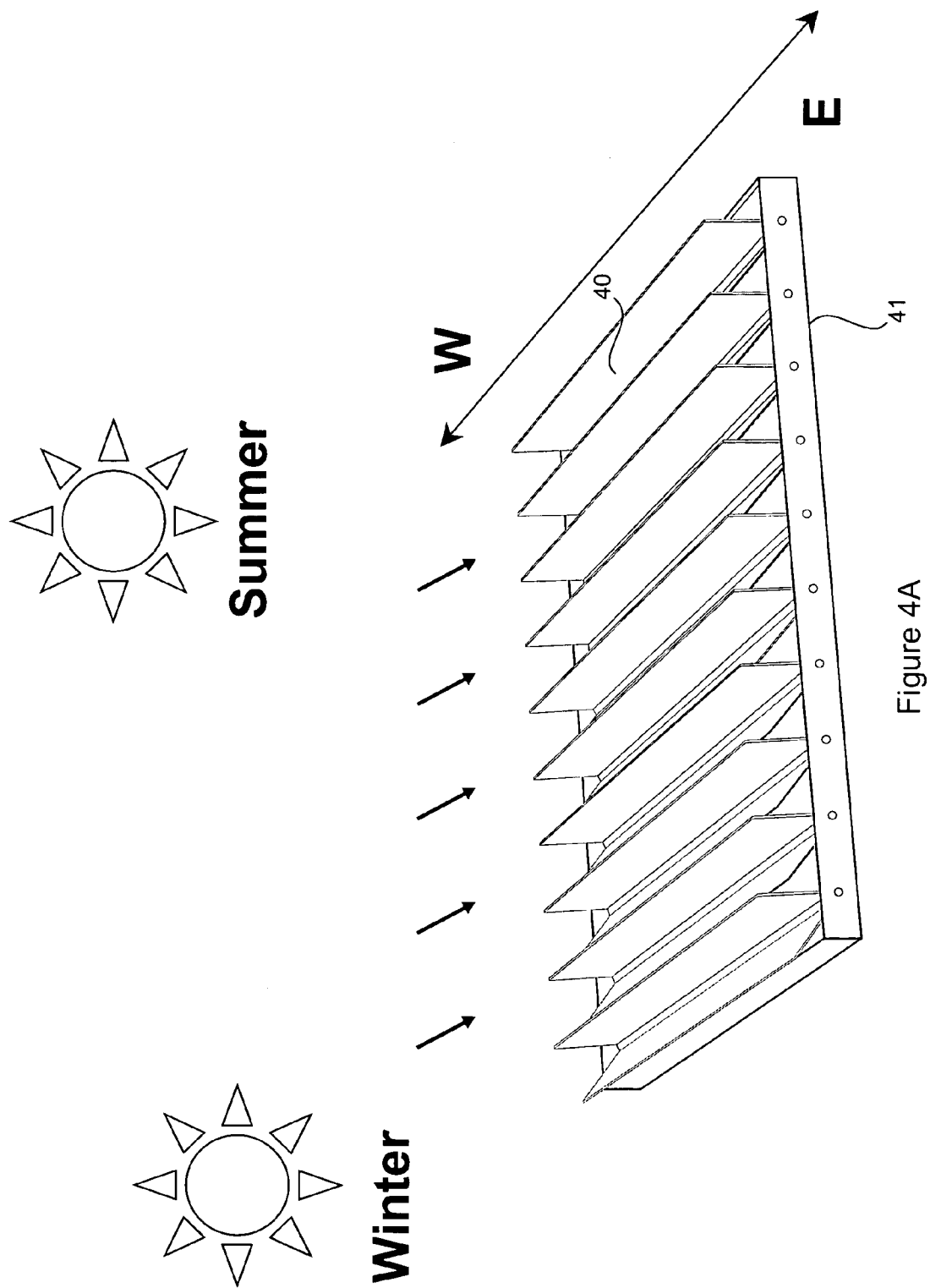
FIG. 4A is diagram showing that for an array of linear solar concentrators aligned in the east-west direction, the maximal required daily change of tracking angle (about 23°) corresponds to the winter and summer solstices. The array of linear solar concentrators is aligned East-West for a maximum daily tracking angle change of 23.5 degrees. Typically, only minor daily changes are employed to retain optimum orientation of the concentrator assemblies through seasonal variations.
Figure 4B:
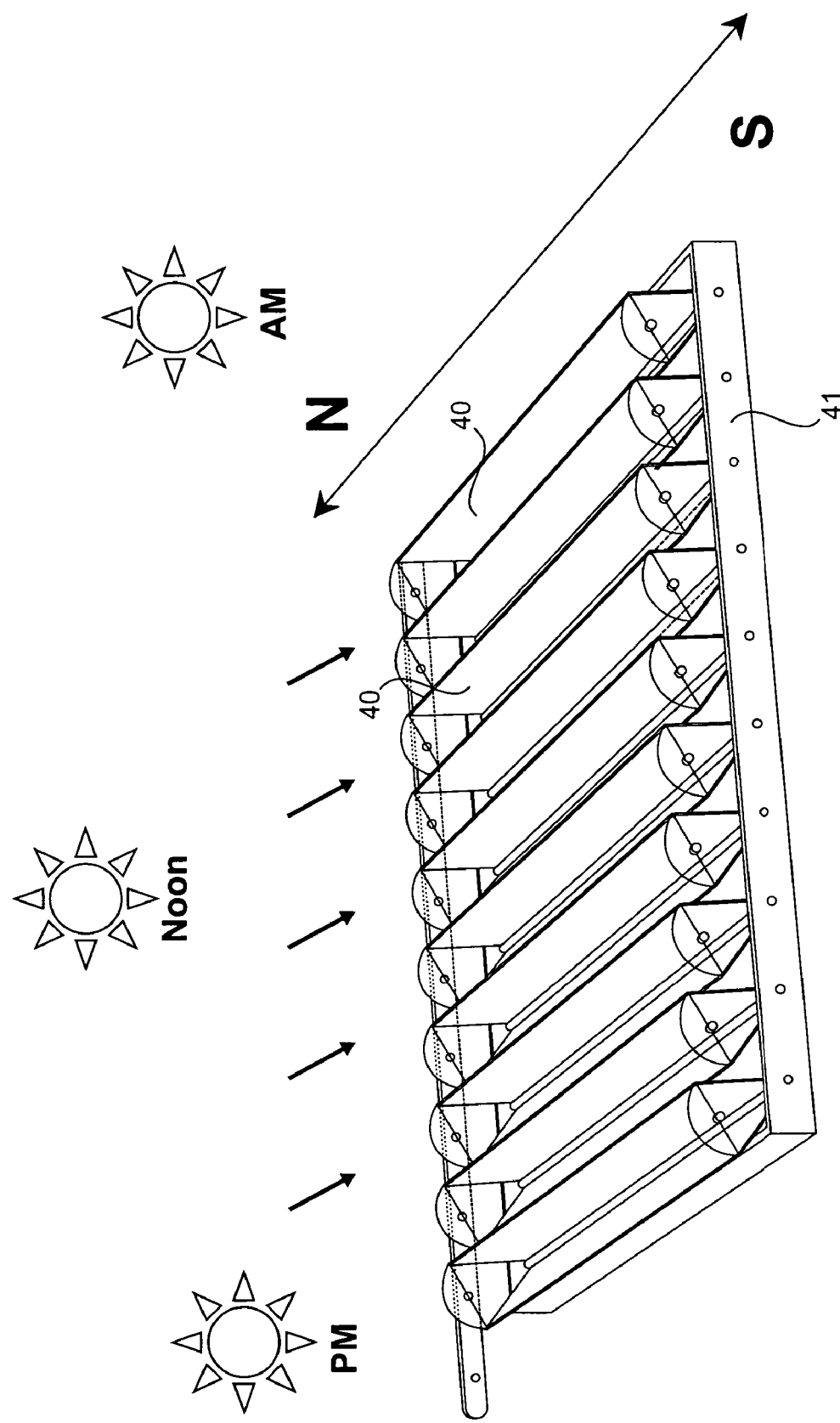
FIG. 4B is a diagram showing that for an array of linear solar concentrators oriented along a north-south direction. Typically, the array of solar concentrator assemblies are moved continuously or at least hourly through the day to retain optimal orientation to collect maximum radiation. For example, the concentrator arrays can experience a large change of tracking angle (between 90° and 180°) over the course of a collection day.

A solar module with an associated array of linear solar concentrators having solar tracking capability, can preferably be installed with the axes of the concentrators aligned in either an east-west orientation or a south-north direction, as illustrated in FIGS. 4A and 4B. The advantage of the east-west oriented alignment is that only a small change of tracking angle is needed during the day and/or over the course of a year, as shown in FIG. 4A. The maximal required daily change of tracking angle is about 23.5°, e.g., at the north pole during summer solstice. During equinox, the daily tracking angle can nearly static (i.e., 0°). Because the required range of tracking angle movements is not great, it is easier to maximize concentrator apertures and minimize mechanical conflict and shadowing between concentrator assemblies 40 as they pivot on module frame 41. When the solar module is placed with the axes of the concentrator assemblies along the north-south direction, as shown in FIG. 4B, efficient capture of solar irradiance can be achieved, but this requires a relatively large daily tracking angle, generally larger than 90° but smaller than 180° (depending, e.g., on the aspect ratio of the linear optical concentrator). The larger tracking angles of the north-south pivot axis can have the disadvantage that the concentrator modules may have to be spaced further apart. In both configurations, there is an advantage over systems wherein the whole frame must pivot to tract the sun because tracking motions of the present invention can take place in a substantially smaller space.

Figure 5:
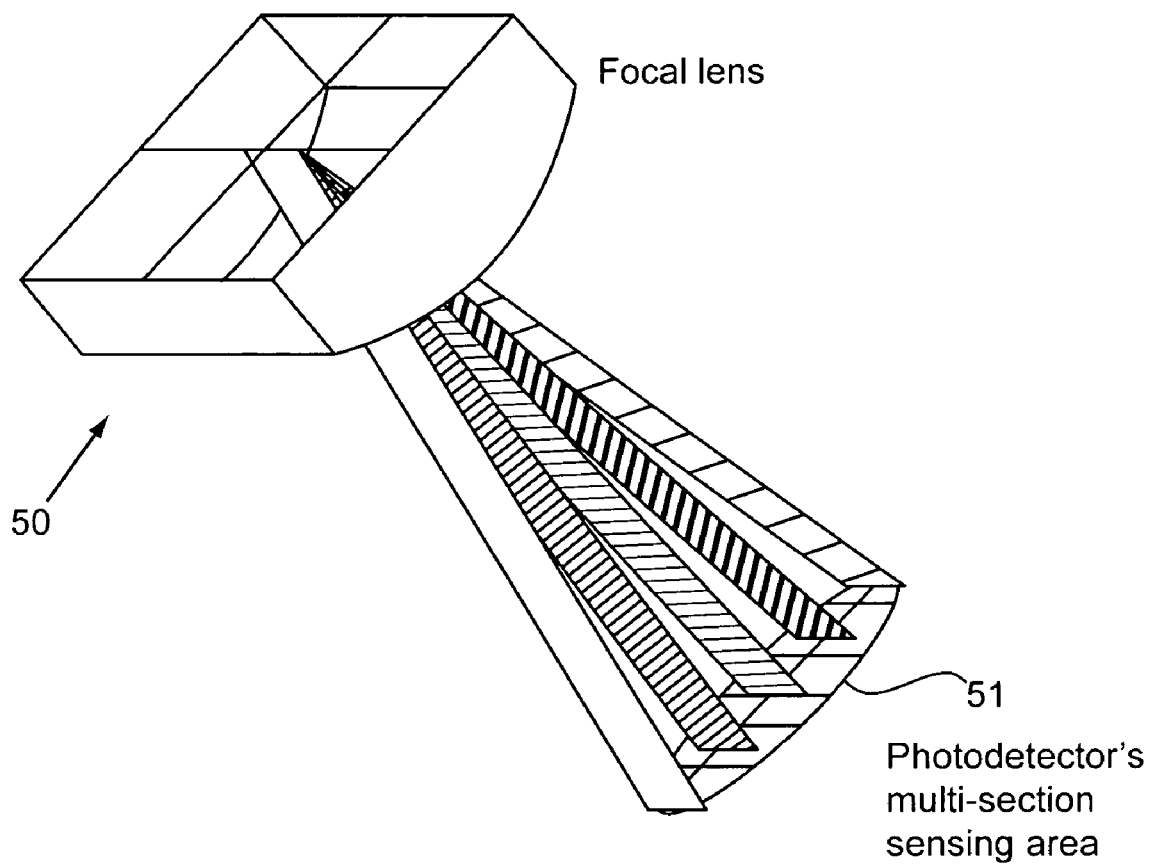
FIG. 5 is a diagram showing that when a symmetrical multi-section photodector is used to differentiate the light intensity distribution, then the angle between the concentrator's aperture normal and the rays of sunlight can be determined. Different shading represents different incident angles relative to the aperture normal of the associated concentrator assembly.

Movement of concentrators can be programmed based on the known position of the solar collector frame, time of year and/or time of day. However, in some embodiments, the tilt angle of the concentrator assemblies can effectively be controlled using feedback from a sunlight angle sensing device. For example, an active tracking scheme (closed-loop tracking) can be used for solar tracking. One method by which this may be accomplished is to place a multi-section photo-detector 50, as shown in FIG. 5, in functional alignment with a solar concentrator assembly. The differentiation of signal intensities from symmetrically distributed sections of a photo-detector array 51 can be detected to determine the angle of the incoming rays of sunlight relative to the aperture normal of the concentrator assembly. Voltages from the array can be fed to a differential amplifier or computer input device that actuates a motor to appropriately control the tilt angle of the associated assemblies.

Other tracking schemes, such as an open-loop tracking system or a combination of open- and closed-loop systems can also be used according to the present embodiments. One method is to use information based on the known astronomical movements of sun-earth system. A computing device can be integrated with the tracking system to provide an accurately clocked solar tracking movement. Another method is to use a global positioning system, or alternative time signals broadcast by local stations, to get the accurate clock information.

Figure 6:
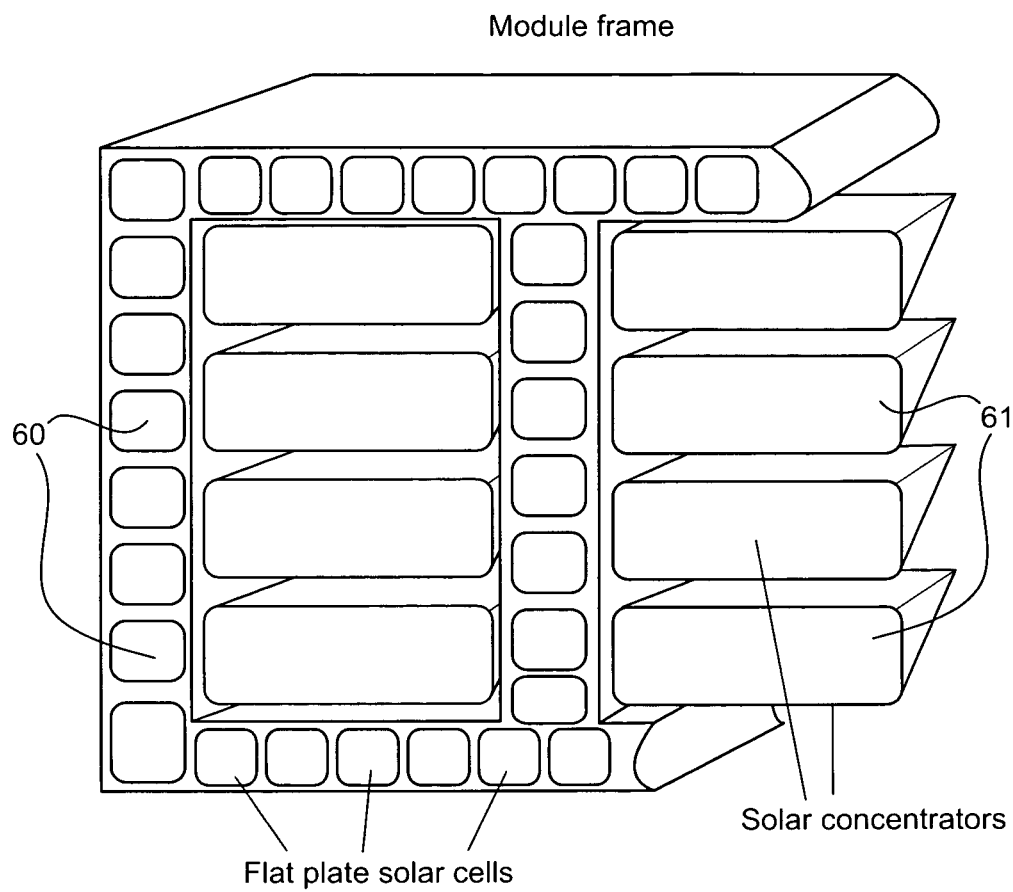
FIG. 6 is a schematic illustration showing an exemplary configuration of flat plate solar cells and solar concentrators in a module frame installation.

The power required to drive the tracking mechanism, and the electronics that control the motion of tracking, can optionally be extracted from a collection of non-concentrated flat-plate solar cells 60 installed alongside the frame edges of a module frame and/or between groups of linear concentrator assemblies 61, as shown in FIG. 6. The function of these "more conventional" solar cells can be to power movements of the solar panel or concentrator array even when the concentrators are not at a tilt angle allowing illumination of the receivers. These flat plate solar cells can also provide supplementary output voltage for the overall system, e.g., by collecting the diffused component of reflected and scattered light from the concentrators within the module, even under diffuse light conditions.

The elongated optical concentrator component (e.g., elongate reflector and/or lens) used in a linear solar concentrator assembly of typical embodiments provides a light concentration factor of about 10 to about 50 onto the receivers in the assemblies. The elongated optical concentrator lens can take different shapes, forms, and configurations, and it may comprise different types of materials. Choices for the concentrator refractive optics components include: a convex lens; a GRIN lens having a refractive index gradient increasing from its center plane; a Fresnel lens; and/or a hybrid lens having a cylindrical lens in the center and a set of total internal refection (TIR) structures on the edges. The lens most suitable for a particular application can depend on a variety of factors, e.g., the aspect ratio, weight, cost and/or the reliability of the structure. Choices for reflective concentrators are, e.g., compound parabolic mirrors; compound hyperbolic mirrors; compound elliptic mirrors; an ideal tubular concentrator; a compound triangular concentrator; a dielectric total internal reflection concentrator; a refractive and reflective concentrator; a refractive and reflective and internal reflection concentrator; and a single mirror with two stages. These concentrators may further include a second concentration stage to further improve the quality and degree of radiation concentration.

Among these choices, a compound parabolic concentrator (CPC) has the advantage of relatively large acceptance angle compared to refractive optics based concentrators. Moreover, with a CPC, the problem of off-focus errors in refractive optics due to a tilted incidence angle can be avoided. A compound parabolic concentrator comprises a pair of parabolic mirror segments 34 having somewhat different focal points 35, but aligned to reflect light with a broad range of incidence angles to the area of the receiver surface. The two parabolic surfaces are typically symmetric with respect to the axis of the CPC. The CPC is a non-imaging concentrator that concentrates light rays that are not necessarily parallel nor aligned with the axis of the concentrator. The geometric concentration ratio of a CPC is related to the acceptance angle by the following expression:

$$CR_g = \frac{1}{\sin\left(\frac{1}{2}\theta_{accept}\right)}$$

where $\theta_{accept}$ is the acceptance angle of the CPC. See, for example, W. B. Stine and M. Geyer in *Power from the Sun*, 2001.

For a linear CPC trough, only one-dimension of seasonal tracking typically is required to substantially maximize the collection of sun irradiance year round if its linear solar receiver is aligned along an east-west direction. In the northern hemisphere, the aperture of a CPC is typically tilted toward the south so that the incident solar irradiance enters within the acceptance angle of the CPC. A CPC's aperture need not be tracked if the incident solar irradiance does not fall outside the CPC's acceptance angle resulting from the sun's apparent motion. The time basis of tracking depends on a CPC's aperture. The tilt of the CPC may need to be adjusted periodically throughout the year, e.g., whenever the incident solar irradiance moves outside the acceptance angle of the CPC. However, tracking may be beneficial on an hourly basis if the sun's declination changes by an amount more than the acceptance angle throughout a day. For example, for a CPC with a concentration ratio of 10, for example ($\frac{1}{2}\theta_{accept}$~5.7°), an adjustment of tilt only once per day can be adequate for an average eight hours collection of sunlight per day over an entire year period.

Figure 7:
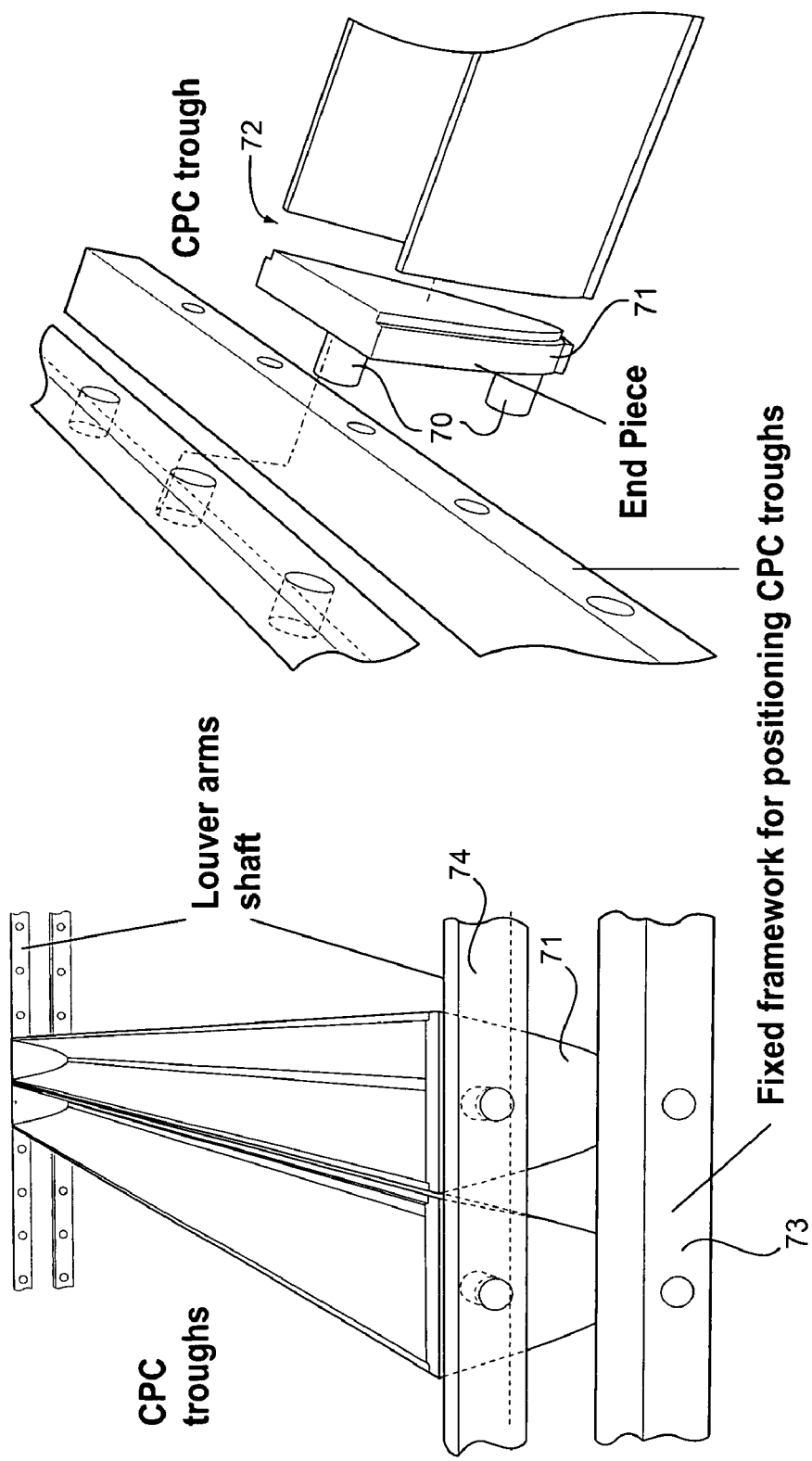
FIG. 7 is a schematic diagram of one mechanical scheme for moving linear compound parabolic concentrator (CPC) assemblies mounted in a module frame.

One scheme for mechanically moving linear CPC troughs is illustrated in FIG. 7. Two actuating rods 70 extending outside the end pieces 71 of a CPC assembly 72 are used to connect the assembly to a fixed framework 73 and a crossbar 74, respectively, at each end of the assembly. The fixed framework can be mounted to the back board (not shown) of the entire solar panel module. The crossbar can be connected to a driving mechanism. With a plurality of linear CPCs being pivotally positioned in a pair of fixed, parallel frameworks, as shown in FIG. 7, the louver arms to which each CPC trough is attached can transfer the driving force to simultaneously pivot all of the CPC troughs about their axes of fittings. Thus, the aperture normal of all the CPCs can be collectively adjusted to follow the sun movement in unison.

Concentrators with Two Degrees of Rotational Freedom

Although concentrator systems with a single degree of freedom can be highly efficient, the present invention optionally includes modules having concentrator assemblies with two degrees of freedom to pivot. Systems with two degrees of freedom have the advantage that they can scan the sky in at all X-Y coordinates to perfectly follow the sun as it crosses the sky. That is, with two degrees of freedom, the concentrator's optical axis can follow the sun east to west during the day, while also tracking the sun along a north-south axis to follow relative movements of the sun associated with the inclination of the earth's axis. Moreover, with precise tracking, the receiver element in the concentrator assembly can be smaller, thus providing a cost benefit.

Figure 8A:
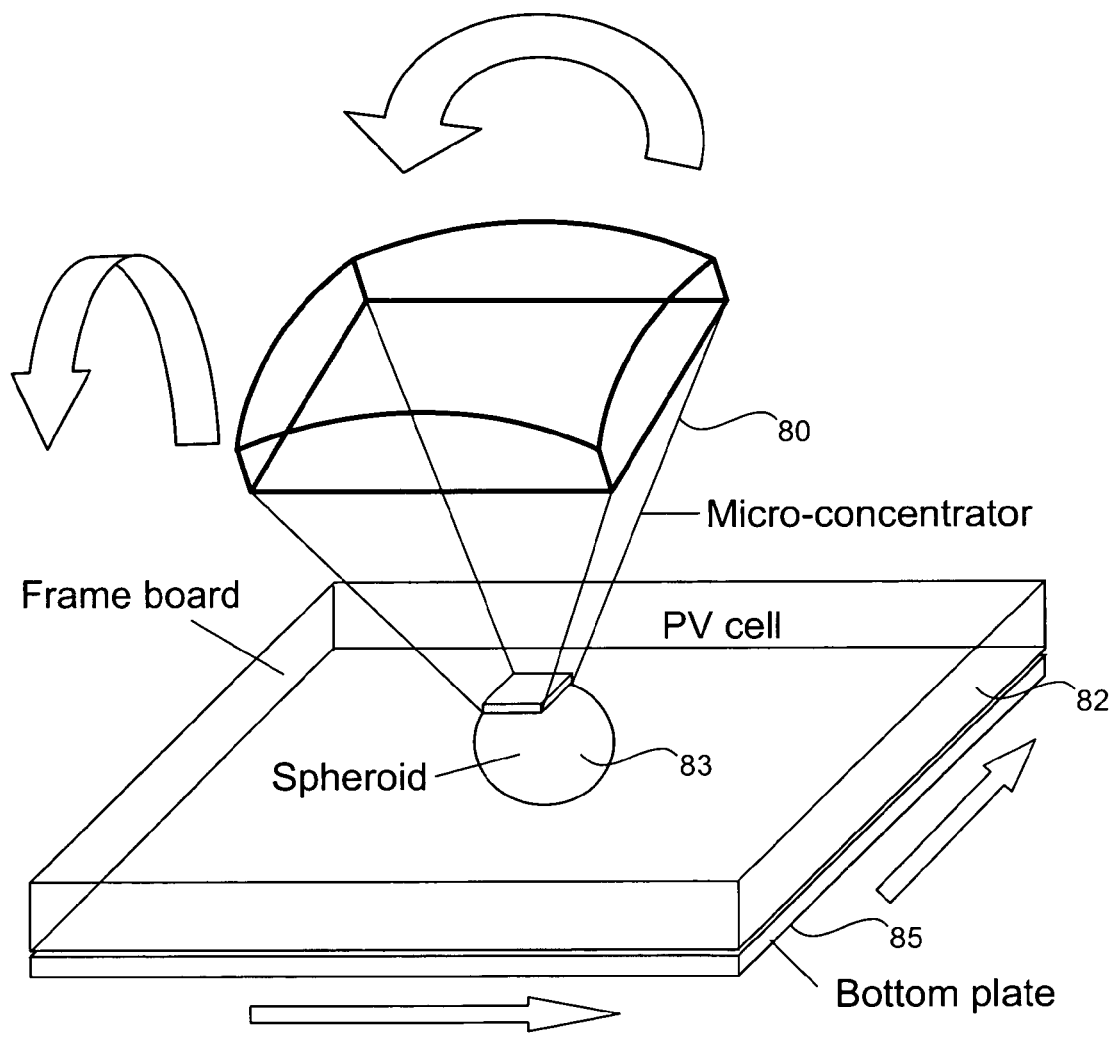
FIG. 8A shows a principle of mechanics for collective 2D sun tracking with a plurality of solar concentrators; a planar shift of the bottom plate translates a concentric rotation of the spheroid tilting the micro-concentrator. Although one concentrator assembly is depicted for simplicity, multiple assemblies can be mounted for coordinated or independent movements.
Figure 8B:
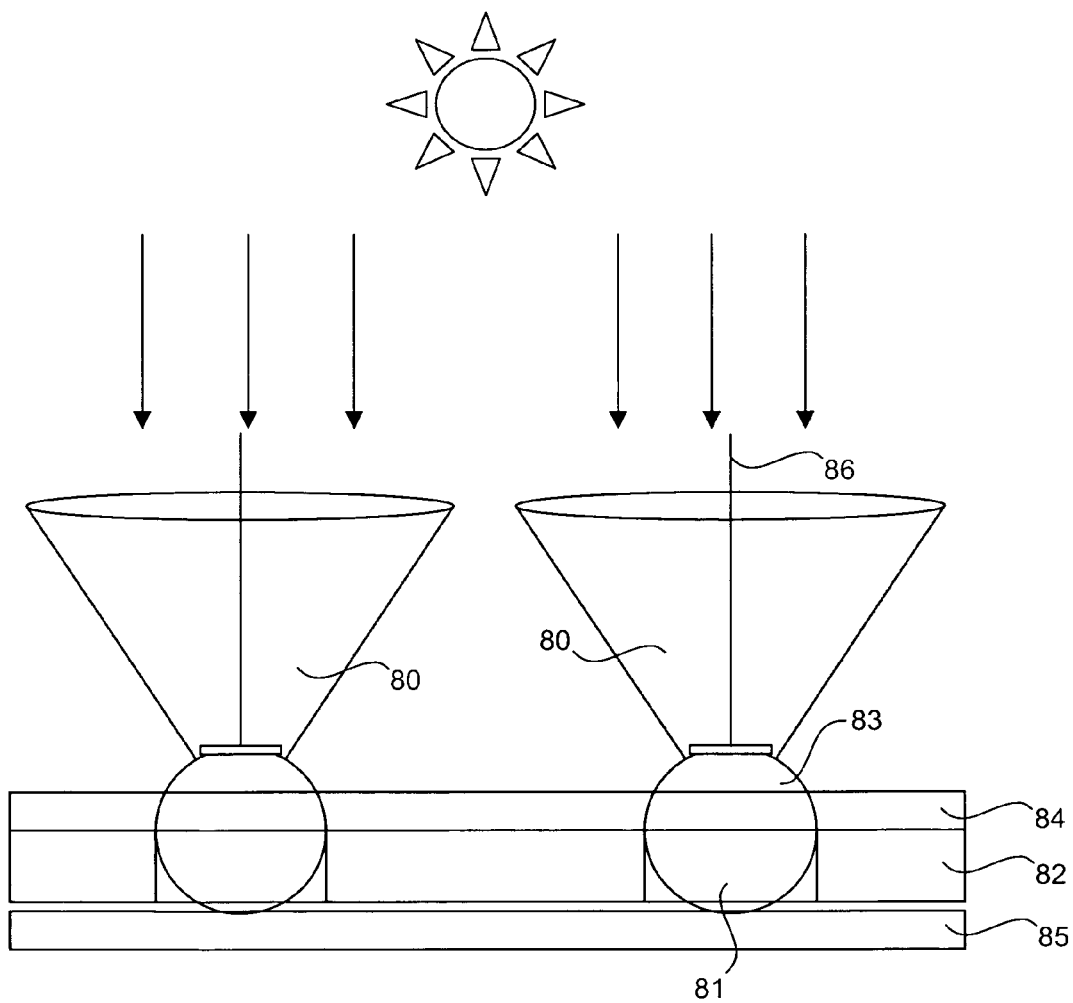
FIG. 8B is a diagram showing how concentrator assemblies can be positioned in the sockets of a frame board, the concentrator and frame board assembly configured to have aperture normals aligned to the direction of the sun at noon.
Figure 8C:
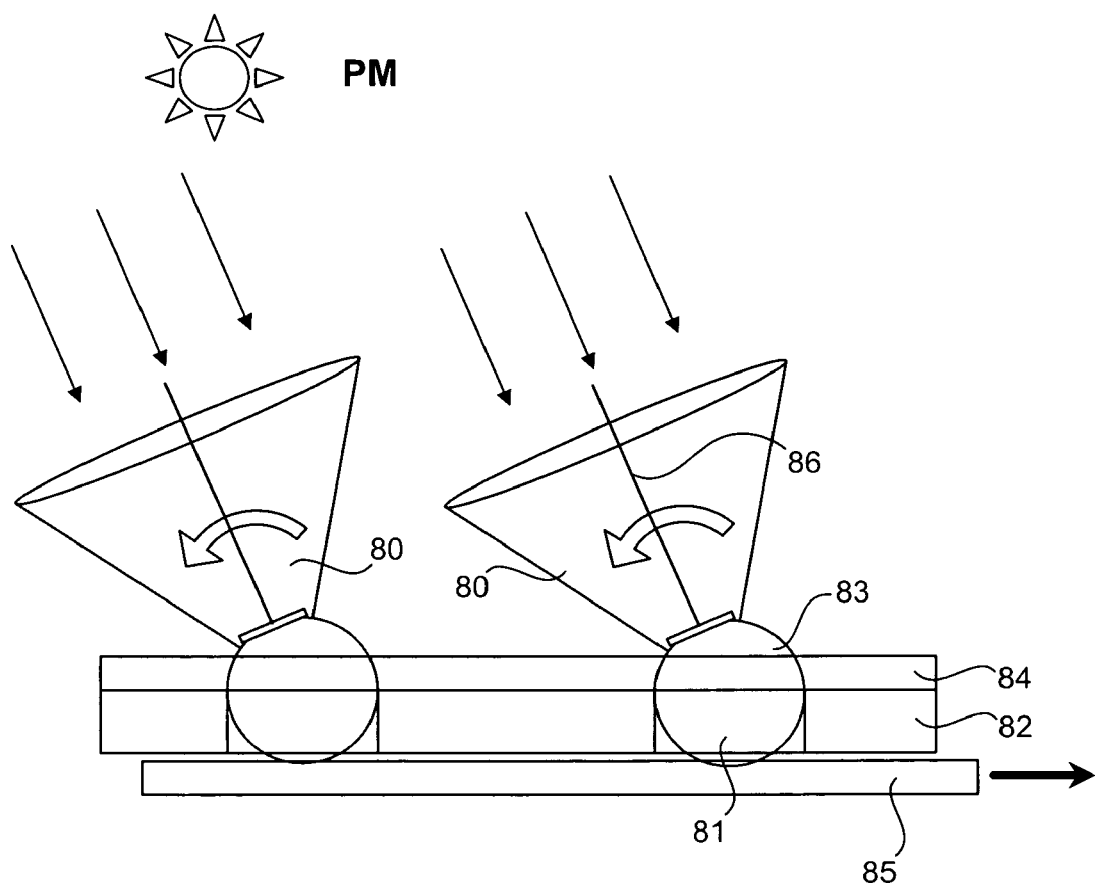
FIG. 8C is a diagram illustrating how a shift of the bottom plate of the solar concentrator assembly toward the east can result in a collective tilting of all the concentrator assemblies toward the west to follow the afternoon sun; the same concept can be applied to a north-south tracking movement.

In preferred embodiments, a number of micro-concentrator assemblies can be mechanically grouped inside a thin module structure. The motions of the concentrator assemblies can be collectively controlled by a mechanical tracking device configured to follow the sun's movement across the sky. FIGS. 8A to 8C illustrate how control of a plurality of individual micro-concentrators can be affected to collectively track in a two-dimensional (2D) manner. A plurality of micro-concentrators 80 can be positioned in socket holes 81 on a frame board 82, with the spheroids 83 being restrained by a top plate 84 mounted on top of the frame board and supported by a bottom plate 85 that can be translated independently, in two perpendicular directions, in the same plane as the top plate or frame board. Such freedom of movement can guarantee the ability of to align the aperture normals 86 of the concentrator assemblies with the sun all day during any season of the year. Alternately, the top plate or frame board can move relative to the bottom plate, or the parts move relative to each other. In such a configuration, the concentrators have only the freedom of angular rotation with respect to the center of their spheroid bases sitting in the sockets, but no substantial freedom to move perpendicular to the plane of the frame. When the bottom plate (designed to have substantial frictional contact with the spheroids) is shifted to one direction by a driving mechanism, the resistance which the moving plate meets with from the surface of the spheroids causes rotation of all the concentrators with a net linear swing substantially opposite to the moving direction of the bottom plate. This occurs assuming the condition that there is rotational friction between the spheroids and the plate. In alternate embodiments, concentrator assembly array members are independently directable on their own dedicated system of controlling frame board, top and bottom plates.

Referring to FIG. 8A to 8C, a 2-D planar translation of a single plate leads simply to the collective two dimensional targeting of the concentrator aperture normals. Substantially the same directing will be provided for each of the individual concentrators. The driving mechanism that can be controlled by a set of solar tracking electronics described below and can be installed either inside or outside the sealed module.

A solar module with micro-concentrator assembly arrays installed inside the module allows for accurate solar tracking capability in a thin module that can remain stationary as a whole. In a preferred embodiment, the module is mounted so that a plane of the module (e.g., the plane of the bottom plate or module frame back) is perpendicular to a line aligned with the sun's rays at around noon on the day of the vernal (or autumnal) equinox. In use, only small changes of north-south tracking angle are needed during the course of a day. The maximum required daily change of tracking angle is about 23°, which corresponds to the angle of the earth's inclination from it's orbit around the sun. During spring and autumn equinox, the daily tracking angle is close to static (0°). A much larger daily tracking angle (generally larger than 90° but smaller than 180°, depending on the aspect ratio of the linear concentrator) is required for east-west tracking for efficient collection of solar radiation as the sun moves across the sky from east to west during the day.

Figure 9:
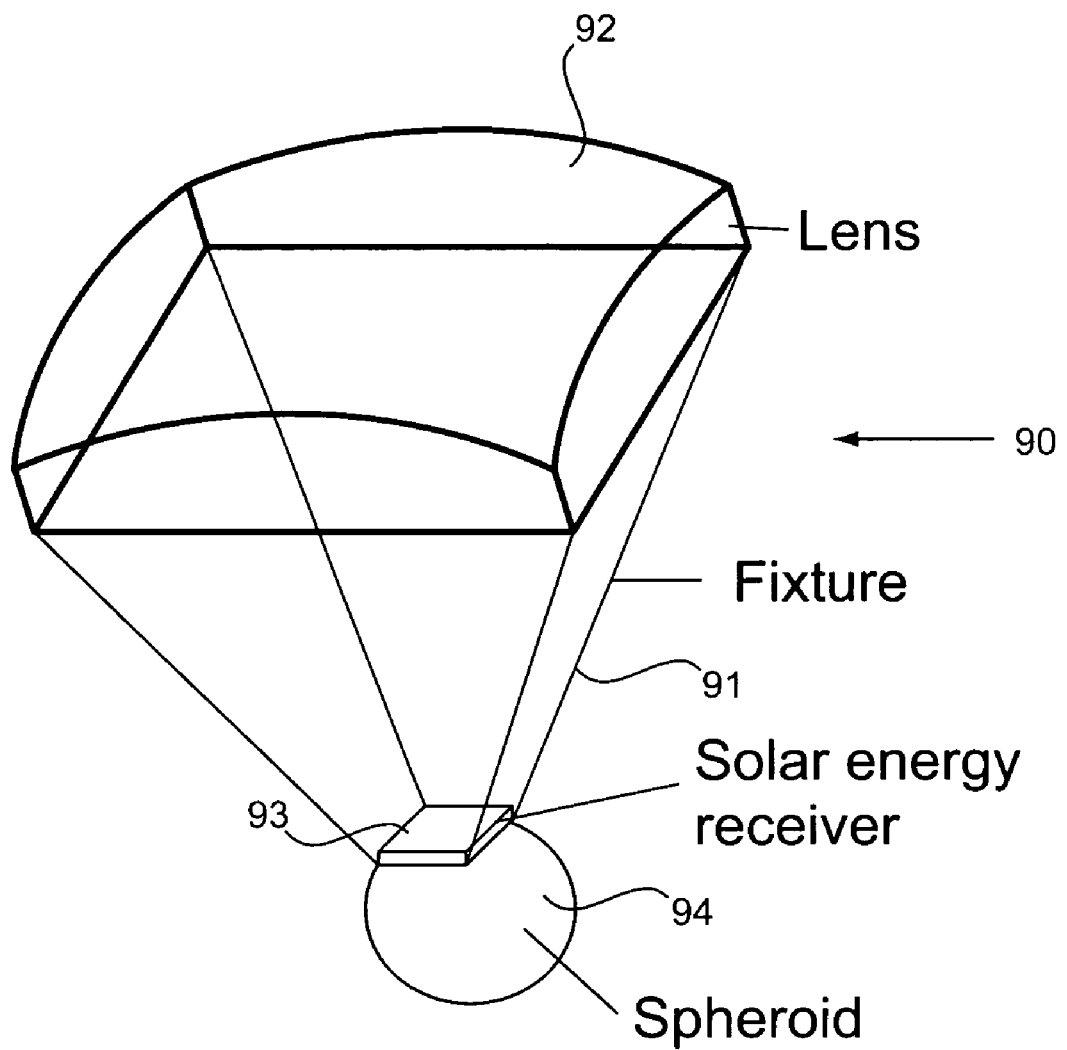
FIG. 9 is a schematic diagram of a solar concentrator assembly with a spheroid pivoting mount enabling two degrees on rotational freedom.

A schematic diagram of an exemplary micro solar concentrator assembly according to the present embodiments is illustrated in FIG. 9. A solar micro-concentrator of the present embodiments can comprise the following: 1) a photovoltaic receiver, 2) a thermoelectric receiver, 3) a combination of both a photovoltaic receiver and a thermoelectric receiver, and 4) a focusing lens (that may be in a circular or square shape) for illuminating the receiver(s) with focused sunlight. The solar micro-concentrator assembly 90 of the present embodiments further includes a fixture 91 to hold the lens and the receiver in a desired orientation (e.g., substantially adjacent to one another, e.g., together), and to attach the lens(es) 92 and receiver(s) 93 onto a spheroid 94, essentially as shown in FIG. 9.

The lens used in a solar concentrator with proper design can provide a concentrating factor of about 100 to about 250 for sun irradiance. The lens can take different forms and be made by different materials. The choice of a lens includes, e.g.: 1) a convex lens, 2) a GRIN lens having a gradient in the refractive index wherein the refractive index increases from axial center, 3) a Fresnel lens, 4) a hybrid lens with a regular lens in the center and a set of total internal refection (TIR) structure on the edges, and 5) combinations thereof. The choice of a lens (or lenses) may depend on the figure of merit in terms of aspect ratio, weight, cost and reliability of the structure of the concentrator. Other choices of concentrators can be, e.g.: 1) a compound parabolic mirror, 2) a compound hyperbolic mirror, 3) a compound elliptic mirror, 4) a compound triangular concentrator, 5) a dielectric total internal reflection concentrator, 6) a refractive and reflective concentrator, 7) refractive, reflective, and internal reflection devices, and their combinations. These contractors can have a second concentration stage to further improve the quality and intensity of the concentration of sunlight.

Further embodiments of the present invention include a sealed module structure with glass superstrate as the top cover, with a bottom cover having the desired thermal conductivity for dissipating the heat that is generated. Dissipating the heat generated by the solar concentrators in a timely fashion is often desirable because this allows the solar cells to function more efficiently. Any or several of the structures in the device may act as a heat sink. For example, the spheroid as a base to the micro-concentrator (the spheroid positioned in the frame board with the freedom of rotation over a certain angle determined by the geometric configuration of the concentrator), as well as the fixture that holds together an optical concentrator element such as a lens and the spheroid on which a solar receiver such as a PV cell attaches, each may serve as heat sink. The heat dissipated from a solar receiver to the spheroid can further be transferred to the frame board through the physical contact between the spheroid and the socket accommodating it on the frame board.

Figure 10:
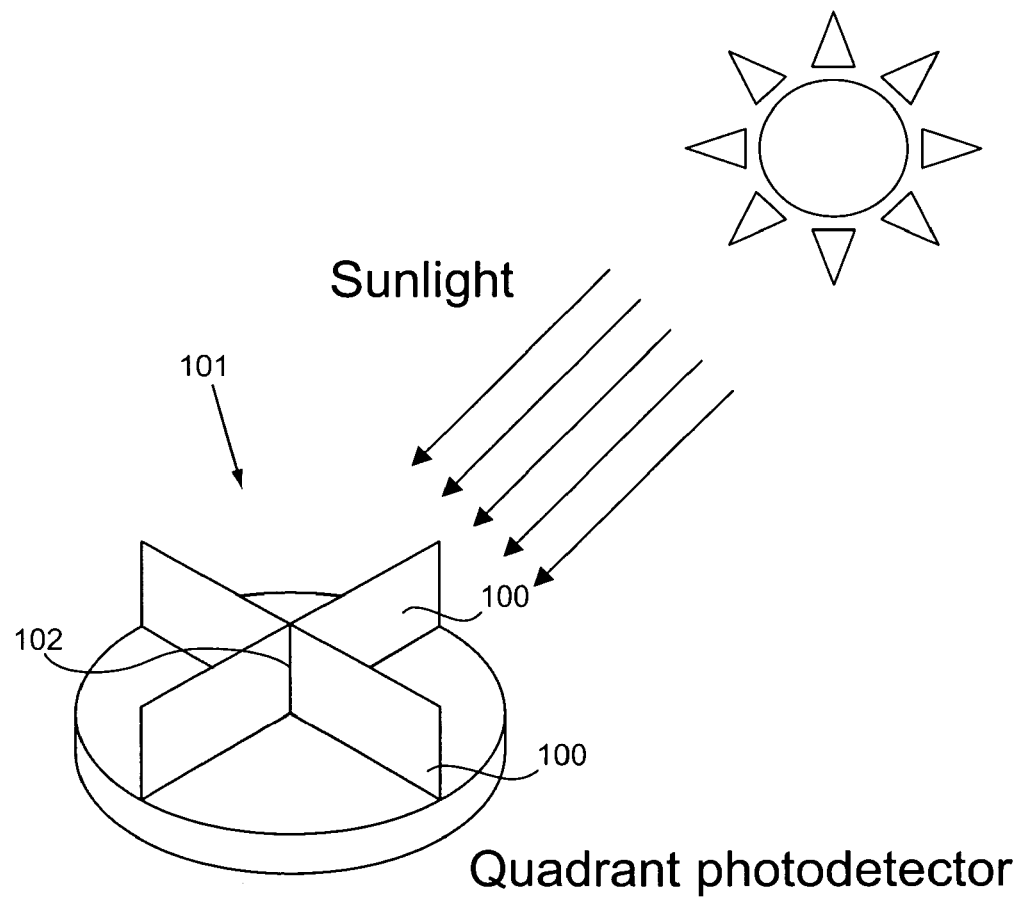
FIG. 10 is a schematic diagram of a system in which a symmetrical quadrant photodector is used to determine the angle between the detector's aperture normal and the rays of sunlight: the partition walls that are perpendicular to each other generate a different shadowing effect on each of four sections as long as the aperture normal of the detector is not parallel to the incoming rays of sunlight (resulting in different intensity readings from all four sections).

To effect 2-D tracking for directing the concentrators as they follow the sun's movement, a quadrant photodetector, as shown in FIG. 10, is functionally mounted, e.g., on a concentrator with it's detector surface in a plane parallel to the plane of the receivers. Referring to FIG. 10, the two orthogonal partition walls 100 on top of the detector 101 will partially shadow the sunlight that shines on the detector when its aperture normal 102 is not pointing directly at the sun. The intensity readings from all four sections of the detector can be monitored to determine what motion, if any, is necessary to direct the solar concentrator modules to align their aperture normal with the incoming rays of sunlight. This information can then be used in real time to continuously determine the optimal direction for the concentrators to track the sun's movement.

Thermoelectric Receivers and Hybrid Receivers

In addition to photovoltaic (PV) solar receivers, thermoelectric (TE) solar receivers can optionally be placed in a concentrator structure for solar energy conversion to electrical energy. Such thermoelectric solar receivers can be used to replace photovoltaic solar receivers, or they can be combined with a photovoltaic receiver in the same module to form a hybrid solar energy converter. It is contemplated that such hybrid solar energy converters will demonstrate a higher level of energy conversion, in part because the longer wavelength portion of solar radiation in the infrared region of the electromagnetic spectrum, which would not ordinarily be converted to electricity by a photovoltaic receiver, can be absorbed by the thermoelectric receiver to generate additional electricity.

Figure 11A:
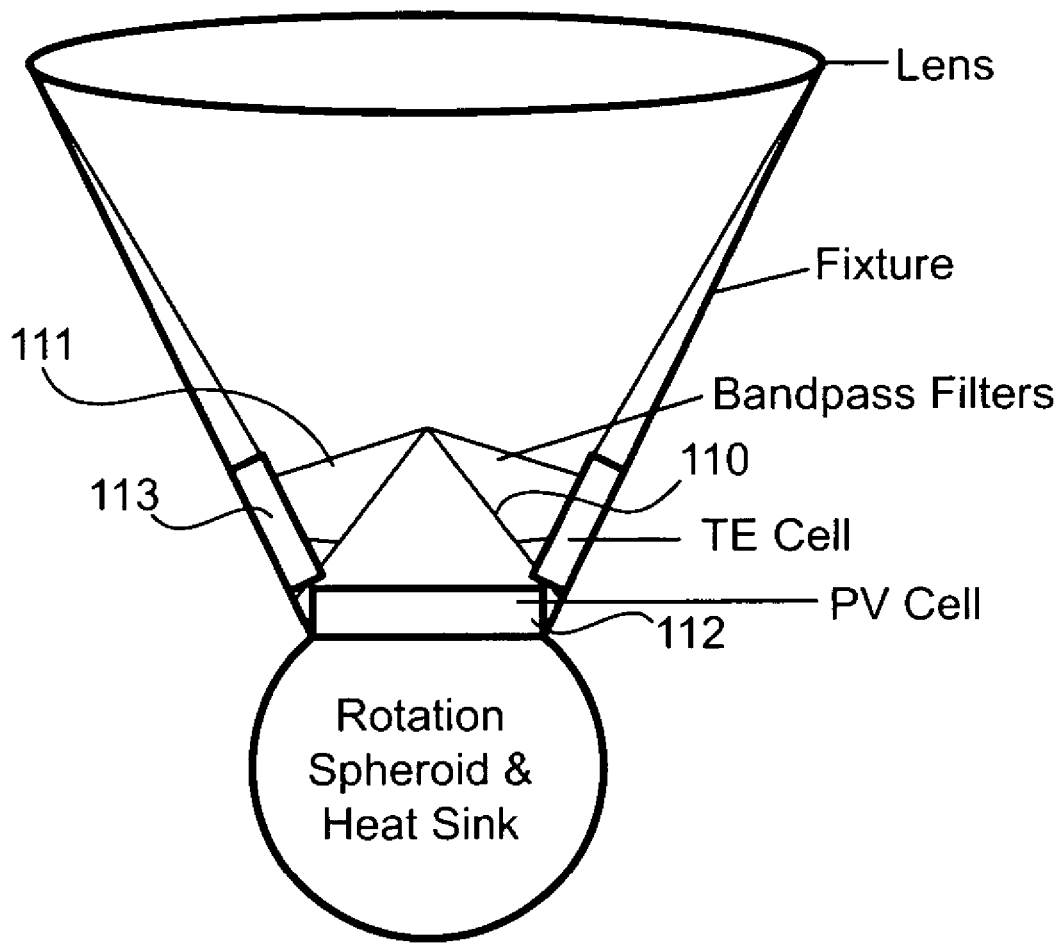
FIG. 11A shows an exemplary configuration of a band-splitting hybrid solar concentrator.
Figure 11B:
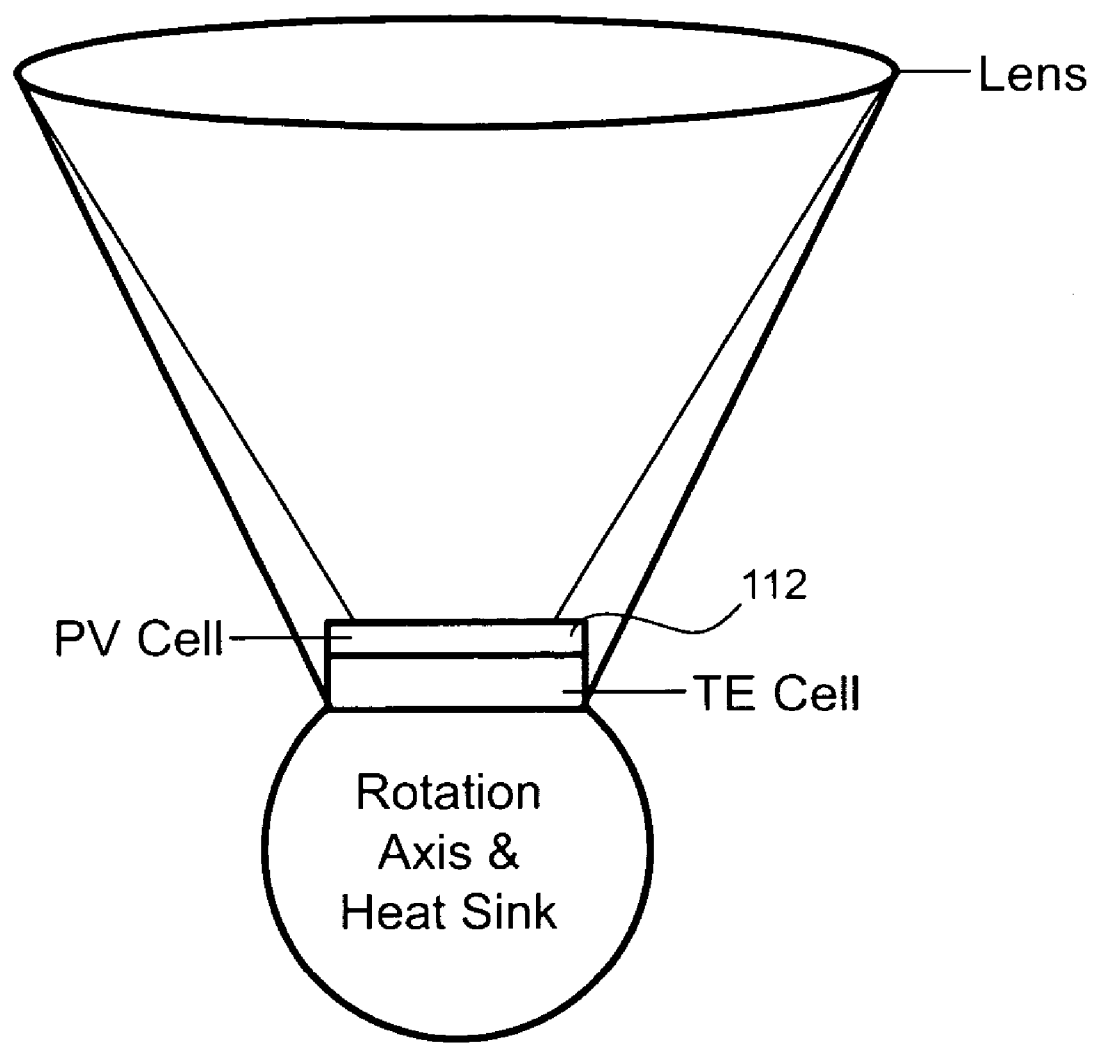
FIG. 11B shows an exemplary stacking configuration for a hybrid solar concentrator; this same configuration can apply to the CPC case as well.

In exemplary embodiments of the present invention, the hybrid solar converter can be implemented: 1) using a shortband pass filter 110 to reflect, or a prism to disperse, the longer-wavelength IR irradiance 111 from sunlight away from PV receivers 112 and more appropriately onto TE receiver surfaces 113 of a concentrator, as shown in FIG. 11A; and 2) stacking a PV receiver 112 together with a TE receiver 113 wherein the PV receiver may be positioned on top. The unabsorbed portion of solar irradiance passes through the top receiver and then reaches the bottom TE receiver, as shown in FIG. 11B. Additionally, the heat generated in the PV receiver may be utilized by the underlying TE receiver in generation of thermoelectricity.

Heat Dissipation Means

Concentration of light at the photovoltaic receivers can result in a large buildup of waste heat. The heat can cause substantial stress on materials and mechanical elements of the system. Moreover, hot photovoltaic cells generally work less efficiently than cool cells. In some embodiments of the invention, thermoelectric devices are incorporated into the systems to convert this waste heat into usable electric voltages. Yet even thermoelectric devices need a cooling means to support the temperature differential required for operation. The present invention offers several heat dissipation options that can be used along, or in combination to prevent overheating and increase the efficiency of the systems.

Figure 12A:
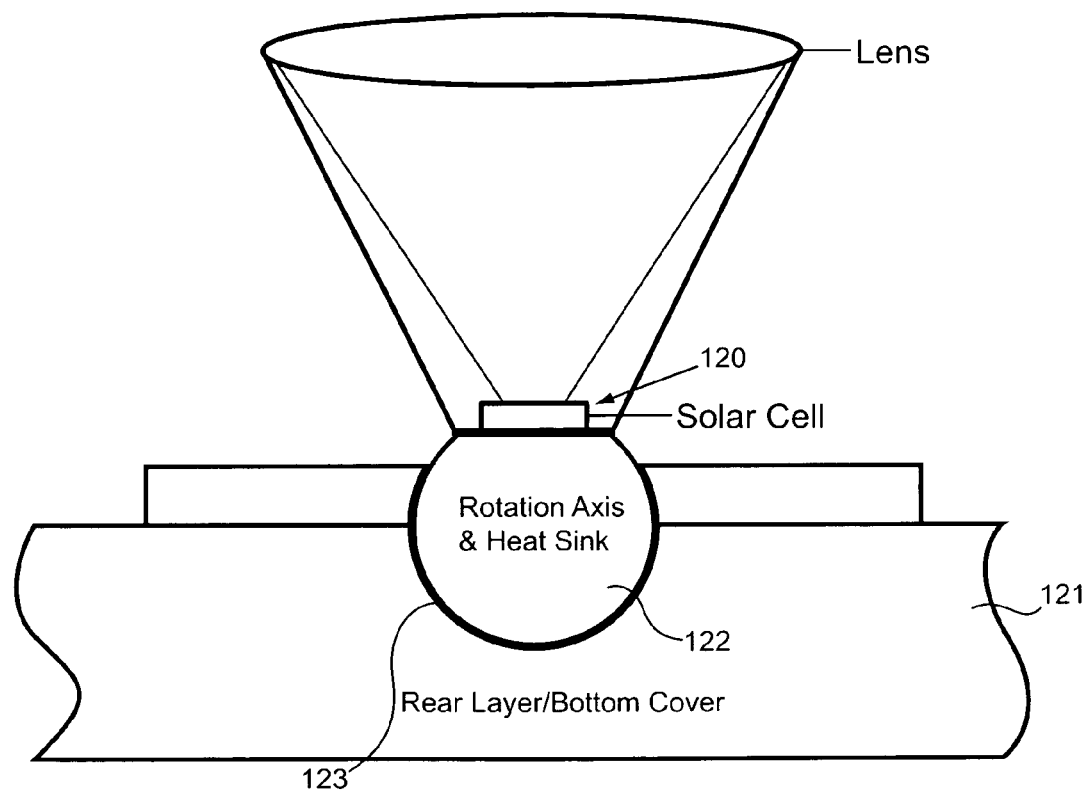
FIG. 12A is a schematic diagram showing a scheme for heat dissipation from a lensed concentrator, and associated mechanical parts provided for such heat dissipation.
Figure 12B:
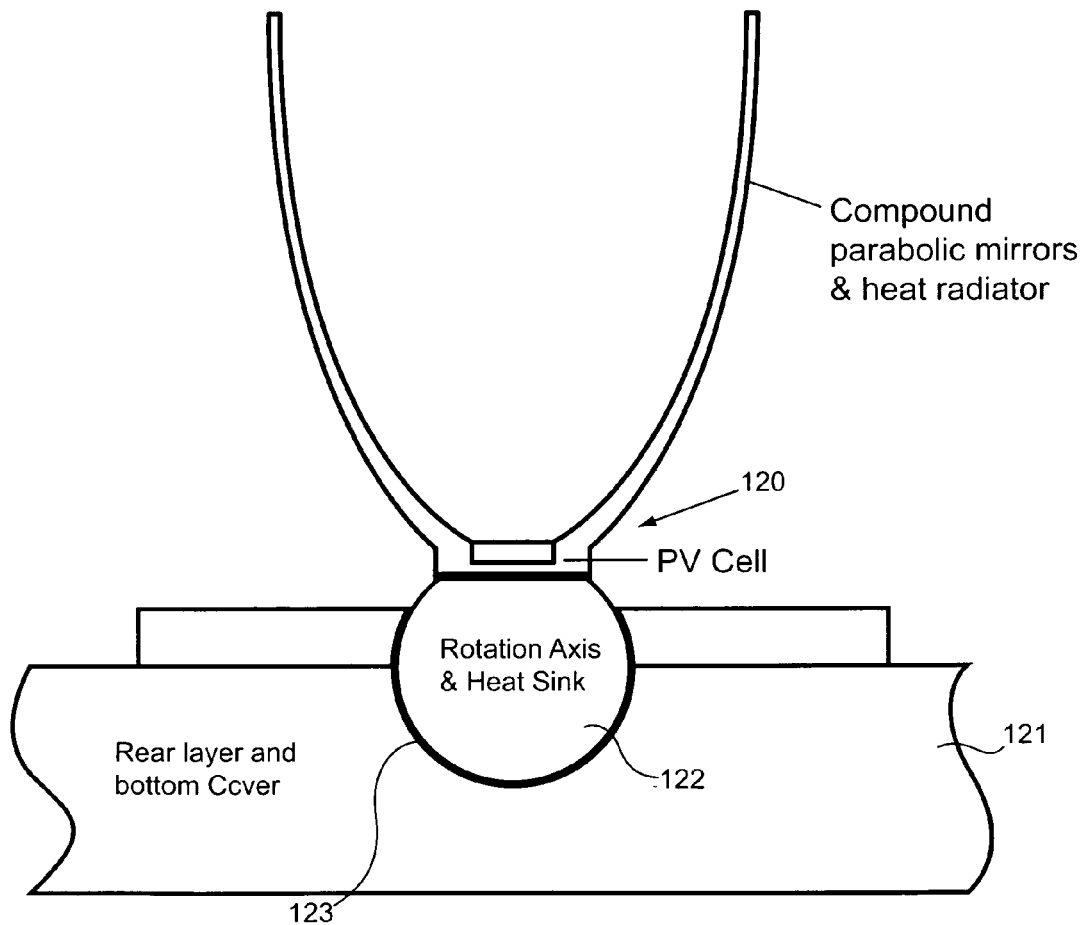
FIG. 12B is a schematic diagram showing a scheme for heat dissipation from a compound parabolic concentrator, and associated mechanical parts provided for such heat dissipation.
Figure 12C:
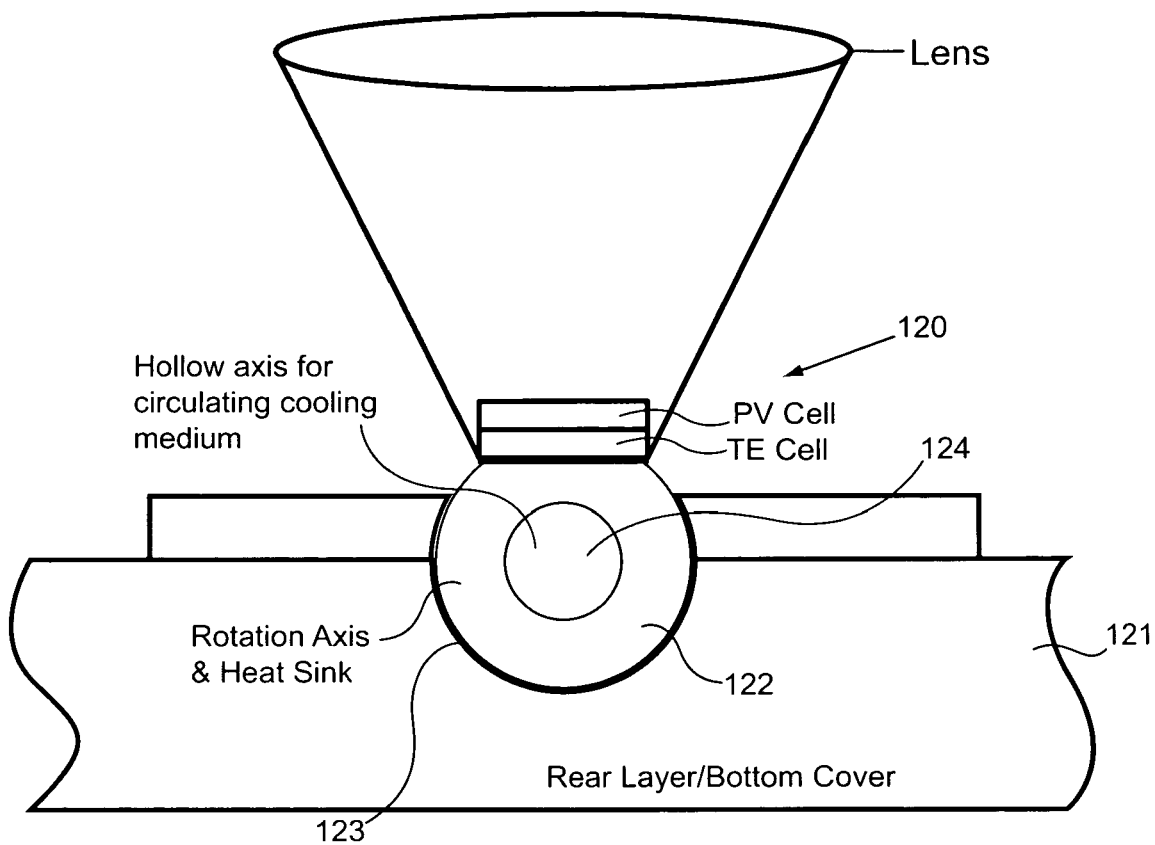
FIG. 12C is a schematic diagram showing another scheme for more efficient heat dissipation using a hollow axis, and associated mechanical parts provided for such heat dissipation; the hollow nature of the axial rod provides a more effective way of heat dissipation by allowing a cooling fluid such as water to flow through the structure.

In one embodiment, the large surface area of the mirror segments in a CPC can be utilized as a radiator for dissipation of heat from its solar receiver. Shown in FIGS. 12A, 12B, and 12C are schemes for dissipating heat from the assemblies using refractive lenses and reflective mirrors. The diagrams also show structural elements responsible for mechanical movement. An exemplary sealed module structure has a glass substrate as the top cover, and a bottom cover 121 having at least adequate thermal conductivity, such that any heat generated in the solar concentrators can be dissipated effectively.

A novel feature of the present embodiments is the thermal conduction that can occur through the pivot axis of the modules and/or arrays, such that heat can be removed from the solar cells to the backing plates, or other heat sinks or heat exchangers, to which the solar cells are associated. Referring to FIGS. 12A-C, a solar concentrator assembly 120 can be clamped to a bottom cover 121 such that the axis of rotation of the solar concentrator has at least 1 degree of freedom of rotation through a certain angle (determined by the geometric configuration of the concentrator). The mounting hardware at the rotational axis can also serve as heat sink to remove heat from any attached solar energy receivers. The heat dissipated from a solar receiver to an axial component can be further transferred to the bottom cover through physical contact between, for example, an axial rod 122 of the concentrator assembly and an axial socket 123 in the cover in which the axial rod is positioned. The movement of surfaces that are in contact with one another may be mediated with a lubricating material that also efficiently transmits heat.

The transfer of heat from the receiver area can optionally be further accelerated by provision of a chamber or conduit in the concentrator structure to receive a coolant fluid. Such coolant fluids can help cool the receivers by evaporation, fluid convection or by carrying heat away in through a coolant loop to an external heat exchanger dissipating heat, e.g., into ambient air. For example, the concentrator pivoting axis mount 122 can include an internal conduit 124 with a coolant fluid that can circulate to remove excess heat from the concentrator. In preferred embodiments, the coolant fluid circulates to a heat exchanger to release heat then returns to the concentrator at a cooler temperature to remove additional heat, as desired.

Condensation Control

Many solar concentrator modules of the invention are designed for residential installations with sealed structures wherein each module houses (or "hosts") a plurality of concentrator assemblies. The concentrators installed in such sealed structures typically have either one degree or two degrees freedom of movement for tracking the sun across the sky, taking into account both daily as well as seasonal positional variations. The sealed structures typically include a clear glass or plastic upper surface through which sunlight is transmitted before impinging on the concentrator and receiver surfaces. The efficiency of such sealed modules can be reduced when moisture inside the structure condenses on the clear surface or surfaces of the concentrator modules.

Disclosed herein is a solar module designed to have one or more compartments for mounting a concentrator assembly. The top cover of the module can be a glass superstrate, and the frames as well as the bottom cover can comprise a metallic material. The reasons for choosing a metallic bottom cover include the mechanical rigidity, chemical stability, and thermal conductivity that metallic materials offer, but of course stiff and chemically resistant polymeric materials (such as, for example, ABS or polystyrene) may also be used.

As discussed above, one foreseeable problem associated with such a compartmented design is that moisture can accumulate inside the enclosure as the temperature of the air inside the module varies. The temperature, relative humidity, enclosure volume and/or enclosure pressure can increase or decrease as conditions change over the course of a day. During daylight hours, for example, the volume of air inside the module can expand as the internal temperature rises, causing a portion of the air inside the module to be forced out into the environment through leaks in the structure. During the night, the air volume inside the module can decrease as the temperature drops, allowing external air to be drawn into the module structure. The air drawn in at night is typically laden with water vapor moisture, which can ultimately condense inside the structure. As a result, the performance of the solar concentrators can be significantly reduced.

Several methods have been used in the past to minimize the condensation of moisture inside a solar module, such as anti-fog coatings and hermetical sealing. Anti-fog coatings are not sufficiently durable to sustain years of climate changing and temperature cycling, and re-coating is impractical once a panel has been installed. The disadvantages associated with hermetic sealing include an increase of pressure within the panel, an increase of up to one third that of the ambient atmosphere, due to heating from sunlight. High-quality construction materials are required to sustain the pressure increase, and this in turn adds to the cost of the module. Hermetic sealing is often lost in any case.

Disclosed herein is are apparatus and methods for trapping water vapor from a volume of air drawn into a solar concentrator module such that only substantially dry air, or air having a low water vapor pressure, enters the module. The purpose of only allowing dry air or substantially dry air to enter the module is to prevent the condensation of water vapor inside the module, which otherwise would have degraded performance.

In one embodiment of the present invention, a solar concentrator system with moisture abatement capability comprises: (1) at least one sealed solar concentrator module configured to allow air to enter and exit the module only through defined channels; (2) at least one water vapor trap fluidly connected to the solar concentrator module through the defined channels; and, (3) associated control hardware, such valves and tubing, to guide and control the air flow.

The solar concentrator module can be a sealed frame structure comprising a chamber with a plurality of concentrator assemblies inside. The sealed module can have one or more open channels extending through the walls of the structure to balance the pressure inside the module with ambient pressure outside. When the module heats up after sunrise and cools down after sunset, the air pressure inside the module first increases and then decreases, respectively. The open channels allow air to flow into and out of the module as internal temperatures fluctuate, thus maintaining a pressure balance between the inside and the outside of the module.

In one embodiment of the present invention, a water vapor trap is connected to the open channel(s) of the solar concentrator module. In this embodiment, substantially all the air flowing into and out of the module is directed to flow through the trap. The water vapor trap can contain moisture absorbents that can efficiently remove moisture from air. Such moisture absorbents can be, e.g., either inorganic or organic-based materials, such as, but not limited to, zeolite, clay, silica gel, lithium chloride (LiCl), and sodium polyacrylate. Properly chosen absorbent materials are capable of absorbing and releasing water with relative ease without decomposition of the absorbent material, and without losing significant absorbing capability.

In this embodiment, the trap removes the moisture from the air being drawn into the module while the module cools down as a result of the sun setting in late afternoon and/or at dusk. This water trapping functionality ensures the dryness of any air entering the module. Temperature increases in the module on illumination by morning sunlight can increase the pressure inside the module and a portion of the air inside can escape from the module to balance the pressure differential between the inside and the ambient (outside). Simultaneously, solar radiation impinging on the solar concentrator system can also heat up the moisture trap, inducing desorption of trapped water adhered to the absorbent material contained the trap. Hot air escaping from the module passes through the trap on its way to the ambient, carrying the desorbed water with it, thus providing a mechanism for regenerating the absorbent trap material. Thus, in a recurring manner, the relative humidity of the air entering the module through the trap is reduced to acceptable levels below which insufficient moisture enters the inside of the module to cause condensation at temperatures encountered day or night.

In one embodiment of the present invention, the body of the trap housing the moisture absorbing material may be either anodized or painted a black or dark color, such that the trap behaves substantially as a black body. In this manner, the heating of the trap by solar irradiation is more efficient. Additionally, the sunlight impinging on the trap can be concentrated to increase the temperature of the trap, thus enhancing the regeneration of the moisture absorbing material.

Such a design is advantageous in that no external power supply is required, as the regeneration of the moisture absorbing material in the water vapor trap is solar powered. Another advantage of the present design is that heating and cooling of the trap occurs simultaneously with the heating and cooling of the solar concentrator module, respectively, so that no active control mechanism is required to synchronize the temperature movement of the trap with the module.

According to the present embodiments, the trap can be installed either within or outside of any solar concentrator module. In a particular embodiment, however, installation of the trap outside the module is preferred for ease of maintenance.

Figure 13:
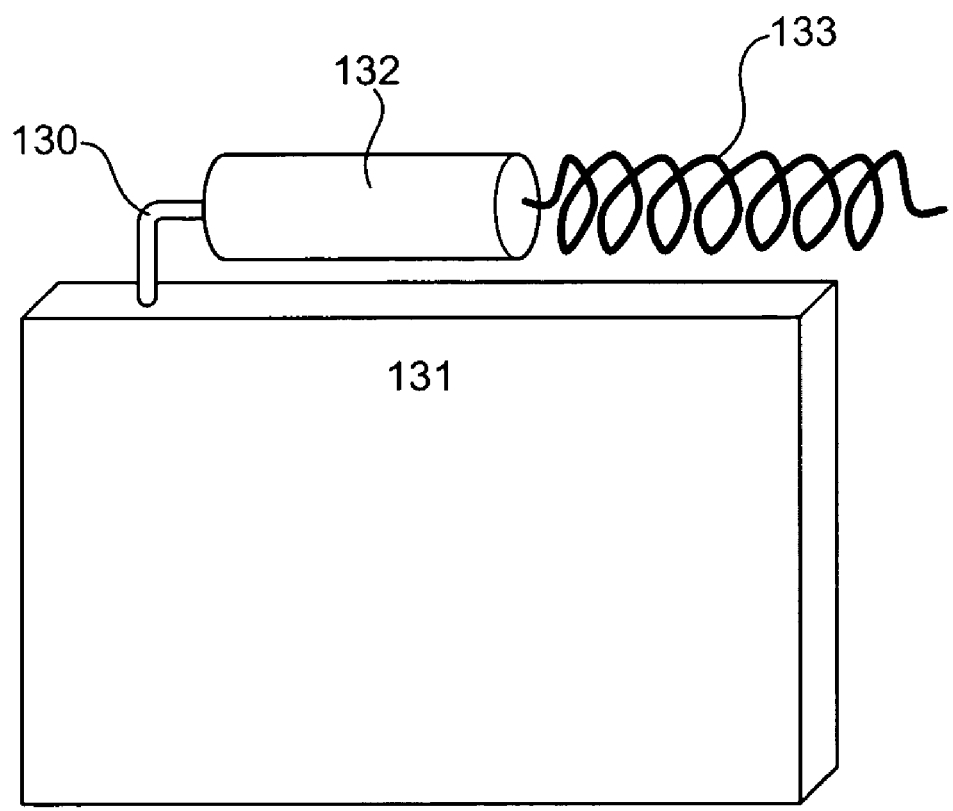
FIG. 13 is a schematic illustration of an exemplary water vapor trap connected to a solar concentrator module.

An exemplary solar concentrator apparatus with moisture abatement capability is illustrated in FIG. 13. An open channel 130 exiting a sealed volume of solar concentrator module 131 is fluidly connected to a water vapor trap 132. A long, external tube 133 (which can be coiled) is fluidly connected to the opposite end of the water vapor trap so that air can flow to and from the concentrator through the channel, trap and external tube. The small diameter and sufficient length of the coiled tube 133 can be chosen such that air guided into and out of the concentrator module via the trap minimizes the diffusion of water vapor from outside atmospheric environment into the trap when the pressures inside and outside the module are balanced. That is, when air is not actively flowing in response to a pressure differential, the length of the moisture trop system prevents substantial moisture from migrating into the concentrator by molecular diffusion.

Figure 14:
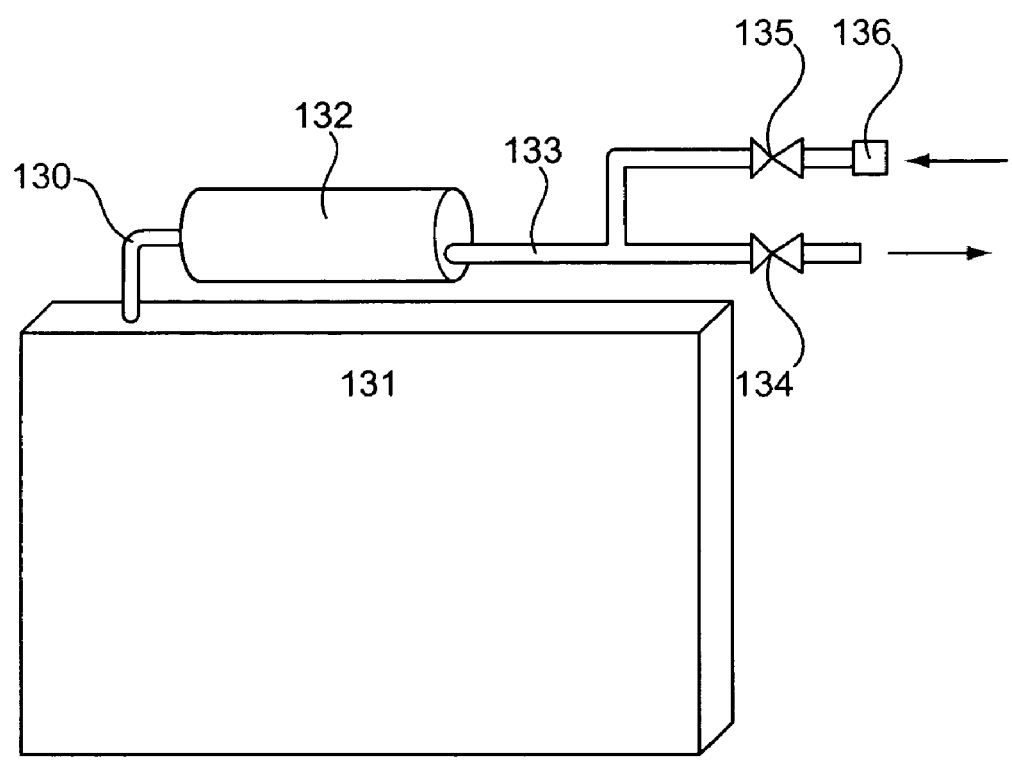
FIG. 14 is a schematic illustration of a moisture-abatement system that uses directional check valves.

In another embodiment, the tubing 133 can optionally comprise or consist of a pair of one-way directional check valves. In this embodiment as illustrated in FIG. 14, check valve 134 only allows air to flow from inside the module to the outside environment, while check valve 135 only permits air to flow from the external environment to the inside of the module. A filter 136 can be used to block dust particles from outer air to enter check valve 135. A certain cracking pressure may be necessary to open any particular check valve. The check valve system can work as follows: the valves remain closed when the difference in air pressure between the concentrator module and the outer ambient pressure is less than the cracking pressure. In this manner, ambient water vapor can not diffuse into the vapor trap, thus reducing migration of external water vapor into the trap when air is not actively flowing into the module.

Figure 15:
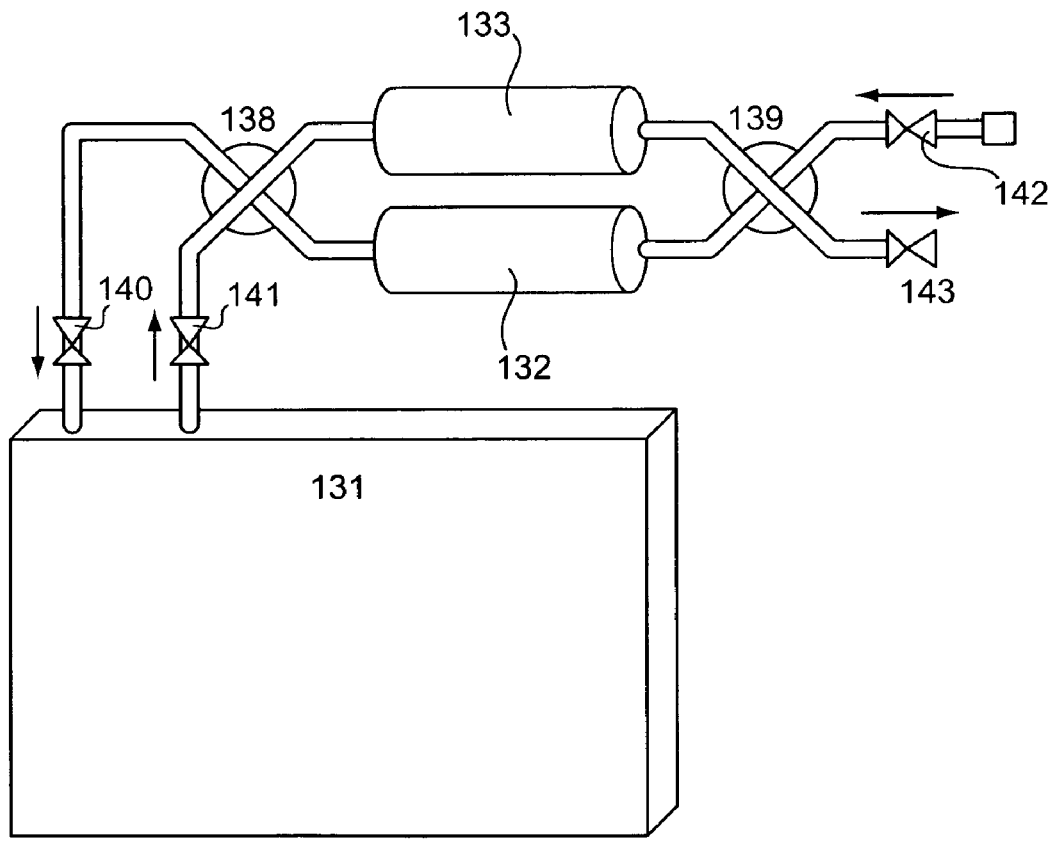
FIG. 15 is a schematic illustration of an exemplary moisture-abatement system having a plurality of water vapor traps, the assembly of water vapor traps connected to a single solar concentrator module.

In another embodiment, a plurality of water vapor traps can be used with a solar concentrator module. This configuration is preferred for the solar concentration systems installed in the regions where humidity is high year around, e.g., where high ambient relative humidity makes significant or high demands on the moisture control system. The configuration illustrated in FIG. 15 differs from the previous two illustrations in that systems used in high or year-round humidity may contain more than one trap, such that a first trap 132, a second trap 137 or both traps can be selected for use. The use of multiple traps in this case can be enabled with the use of valves 138 and 139. For example, air into and out of the module can be directed to flow to or from module 131 through check valve 140, directional control valve 138, trap 132, directional control valve 139, and check valve 142 in contact with the external environment. If check valve 142 is out of service, or for any reason, the air can be directed from trap 133 to the ambient via check valve 143. Alternatively, air into and out of the module can be directed to flow through fluidly connected channels from the module 131 through check valve 141 and then through directional control valve 138 to trap 133, then through directional control valve 139 to the check valve 143 to the external environment. Similarly, if check valve 143 is out of service, or for any reason, the air may be directed through trap 133 to the via check valve 142.

Figure 16:
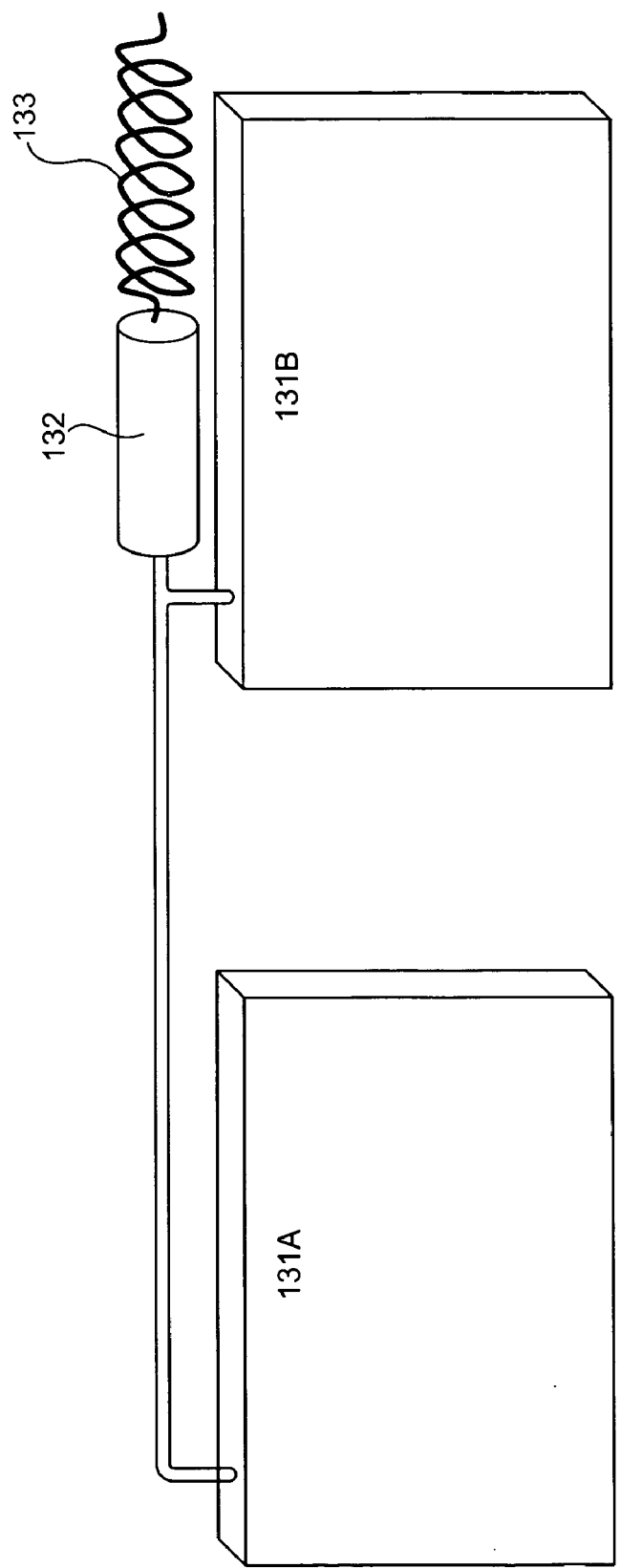
FIG. 16 is a schematic illustration showing how a single water vapor trap may be shared by a plurality of solar concentrator modules.

In the regions where humidity is relatively low year around, where moisture abatement demands on the system are low or lower than average, a plurality of solar concentrator modules can be connected together to share a single water vapor trap. This embodiment is illustrated in FIG. 16. Here, a single trap 132 and coil 133 can service two different modules 131A and 131B.

It is understood that the examples and embodiments described herein are for illustrative purposes only and that various modifications or changes in light thereof will be suggested to persons skilled in the art and are to be included within the spirit and purview of this application and scope of the appended claims.

While the foregoing invention has been described in some detail for purposes of clarity and understanding, it will be clear to one skilled in the art from a reading of this disclosure that various changes in form and detail can be made without departing from the true scope of the invention. For example, many of the techniques and apparatus described above can be used in various combinations.

All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:

1. A solar-electric module comprising:
an array comprising four or more concentrator assemblies each separately pivotably mounted in the same plane with two degrees of freedom and each assembly comprising a photovoltaic receiver or thermoelectric receiver, and each comprising one or more optical reflectors or lenses configured concentrate sunlight by reflection or refraction onto the photovoltaic receiver or thermoelectric receiver; and,
a tracking mechanism configured to separately move each member of the concentrator array through two degrees of rotational freedom; wherein the tracking mechanism comprises:
a top plate comprising a perforated plane;
a bottom plate that can be linearly translated relative to the top plate in two perpendicular directions along the plane; and,
one or more spheroids attached to each concentrator array member and retained between the top plate and bottom plate with the optical concentrators projecting above the top plate;
whereby relative motion of the top and bottom plate rolls the spheroids and rotates the concentrators in unison through one or two degrees of rotational freedom; whereby the array members of the concentrator array are moved in unison to each follow the relative movement of the sun across the sky.

2. The module of claim 1, wherein the module comprises a stationary frame within which the concentrator array members are each pivotably mounted.

3. The module of claim 1, wherein the concentrator assemblies comprise both photovoltaic cells and thermoelectric cells.

4. The module of claim 1, wherein the concentrator assemblies comprise optical concentrators selected from the group consisting of: a lens, a parabolic reflector, a compound parabolic mirror, a compound hyperbolic mirror, a compound elliptic mirror, a compound triangular concentrator, a dielectric total internal reflection concentrator, a refractive and reflective concentrator, a refractive optical device, a reflective optical device, a internal reflection optical device, and combinations thereof.

5. The module of claim 1, wherein the lens is selected from the group consisting of a convex lens, a GRIN lens, a Fresnel lens, a hybrid lens having a regular lens in the center and a set of total internal refection (TIR) structure on the edges, and combinations thereof.

6. The module of claim 1, wherein the concentrator assemblies are configured to provide a solar radiation concentration factor ranging from about 100-fold to about 250-fold.

7. The module of claim 1, wherein the tracking mechanism further comprises a frame board mounted between the top plate and bottom plate and comprising sockets to receive the spheroids.

8. The module of claim 1, wherein the tracking system first degree of freedom ranges through at least 23 degrees of rotation and the second degree of freedom ranges through at least 180 degrees of rotation.

9. The module of claim 2, wherein the concentrator assemblies are sealed within the fixed frame.

10. The module of claim 1, wherein the four or more assemblies do not have three degrees of freedom.

* * * * *